(12) United States Patent
Kajimoto

(10) Patent No.: US 8,779,656 B2
(45) Date of Patent: Jul. 15, 2014

(54) ORGANIC ELECTROLUMINESCENCE ELEMENT, AND LIGHT EMITTING APPARATUS, IMAGE FORMING APPARATUS, LIGHT EMITTING ELEMENT ARRAY, DISPLAY APPARATUS, AND IMAGING APPARATUS EACH USING THE ELEMENT

(75) Inventor: Norifumi Kajimoto, Chiba (JP)

(73) Assignee: Canon Kabushiki Kaisha, Tokyo (JP)

( * ) Notice: Subject to any disclaimer, the term of this patent is extended or adjusted under 35 U.S.C. 154(b) by 160 days.

(21) Appl. No.: 13/564,500

(22) Filed: Aug. 1, 2012

(65) Prior Publication Data

US 2013/0038640 A1 Feb. 14, 2013

(30) Foreign Application Priority Data

| Aug. 12, 2011 | (JP) | 2011-176583 |
| Feb. 3, 2012 | (JP) | 2012-021715 |
| Jul. 17, 2012 | (JP) | 2012-158263 |

(51) Int. Cl.
*H01L 51/52* (2006.01)

(52) U.S. Cl.
USPC ........................................... 313/504

(58) Field of Classification Search
CPC ................ H01L 51/5262; H01L 2251/558; H01L 51/5048; H01L 51/5072; H01L 51/5092; H01L 51/5056; C09K 11/06; G02F 2203/10; H01S 5/0683; G02B 5/008
USPC ................................. 313/498–512
See application file for complete search history.

(56) References Cited

U.S. PATENT DOCUMENTS

| 5,022,726 | A | 6/1991 | Austin et al. |
| 7,126,269 | B2 | 10/2006 | Yamada |
| 7,518,141 | B2 | 4/2009 | Nakamura |
| 2005/0099113 | A1 | 5/2005 | Yamada |
| 2007/0228367 | A1 | 10/2007 | Nakamura |
| 2008/0218063 | A1 | 9/2008 | Greiner |

FOREIGN PATENT DOCUMENTS

| JP | 2003-109775 A | 4/2003 |
| JP | 2007-294421 A | 11/2007 |
| JP | 2008-543074 A | 11/2008 |

OTHER PUBLICATIONS

J. Frischeisen et al., "Increased light outcoupling efficiency in dye-doped small molecule organic light-emitting diodes with horizontally oriented emitters". Organic Electronics 12 (2011) 809-817.
S. Nowy et al., "Light extraction and optical loss mechanisms in organic light-emitting diodes: Influence of the emitter quantum efficiency". J. Appl. Phys. 104, 123109 (2008).
H. Riel et al., "Phosphorescent top-emitting organic light-emiting devices with improved light outcoupling". Applied Physics Letters; vol. 82, No. 3; Jan. 20, 2003.
J. Burke et al., "Surface-polariton-like waves guided by thin, lossy metal films". Physical Review B; vol. 33, No. 8; Apr. 15, 1986.

(Continued)

*Primary Examiner* — Donald Raleigh
(74) *Attorney, Agent, or Firm* — Fitzpatrick, Cella, Harper & Scinto

(57) ABSTRACT

Provided are organic electroluminescence elements that suppress SP loss even in a strong cavity satisfying a λ/4 interference condition, thereby being improved in luminous efficiency. The organic electroluminescence elements emit light having a peak wavelength of 440 nm or more to 470 nm or less, in which a wavenumber difference δk (Re) between surface plasmons generated at respective reflecting electrode and transparent electrode falls within a specific range.

16 Claims, 13 Drawing Sheets

(56) References Cited

OTHER PUBLICATIONS

I. Gontijo et al., "Coupling of InGaN Quantum-well Photoluminescence to Silver Surface Plasmons", Physical Review B, vol. 60, No. 16, pp. 11 564-11 567 (Oct. 1999).

L. H. Smith et al., "Field Profiles of Coupled Surface Plasmon-Polaritons", Journal of Modern Optics, vol. 55, No. 18, pp. 2929-2943 (Oct. 2008).

Handbook of Optical Constants of Solids III, E.D. Palik, editor, Academic Press, pp. 235-239, (1998).

U.S. Appl. No. 13/564,405, filed Aug. 1, 2012.

101b-a: Ag(200)/HTL(23)/EML(20)/ETL(∞)
102b-a: Al(200)/HTL(23)/EML(20)/ETL(∞)
b-c: HTL(∞)/EML(20)/ETL(35)/Ag(26)/OCL(65)/Air

ORGANIC ELECTROLUMINESCENCE ELEMENT, AND LIGHT EMITTING APPARATUS, IMAGE FORMING APPARATUS, LIGHT EMITTING ELEMENT ARRAY, DISPLAY APPARATUS, AND IMAGING APPARATUS EACH USING THE ELEMENT

BACKGROUND OF THE INVENTION

1. Field of the Invention

The present invention relates to an organic electroluminescence (EL) element, and also, relates to a light emitting apparatus, an image forming apparatus, a display apparatus, and an imaging apparatus each using the organic EL element.

2. Description of the Related Art

In recent years, an organic EL element that emits light spontaneously with a low driving voltage of about several volts is drawing attention. The organic EL element has a construction in which a reflecting electrode having a metal reflective layer, an emission layer, and a transparent electrode are laminated. Due to excellent features such as surface emitting characteristics, light weight, and visibility the organic EL element is being put into practical use as a light emitting apparatus of a thin display, lighting equipment, a head-mounted display, or a light source for a printhead of an electrophotographic printer.

Along with a demand for low power consumption of a display apparatus constructed using the organic EL element, improvement of luminous efficiency of the organic EL element is being expected. One of element structures improving the luminous efficiency remarkably is a micro cavity system. Light emitting molecules have a feature of radiating light strongly toward a space in which "enhancing interference" of light occurs. Specifically, the radiation rate of excitons can be increased and the radiation pattern thereof can be controlled through use of optical interference. According to the micro cavity system, element parameters (film thickness and refractive index) are designed so that the "enhancing interference" occurs in a light-extraction direction viewed from light emitting molecules. In particular, it is known that, in the case where a distance $d_0$ between the metal reflective layer and the emission layer satisfies the condition: $d_0 = \lambda/(4n_0)$ (hereinafter, referred to as $\lambda/4$ interference condition), a radiation intensity is increased most by an interference effect. Here, $\lambda$ indicates a peak wavelength (in a vacuum) of a PL spectrum of light emitting molecules, and $n_0$ corresponds to an effective refractive index between a light emitting point and a metal reflective layer. According to the micro cavity system, it is not necessary to use an uneven structure such as a microlens, and an increase in the luminous efficiency at low cost can be expected.

In addition, a micro cavity is classified into a weak micro cavity and a strong micro cavity depending on the magnitude of a reflectance on a light-extraction side. Generally, in the weak cavity, an electrode structure having a high transmittance such as a glass/transparent oxide semiconductor is used, and an interference effect of the cavity is determined mainly by an interference condition between a metal reflective layer and the emission layer. On the other hand, in the strong cavity, a semi-transparent metal thin film having a high reflectance is used as a transparent electrode on the light-extraction side. Therefore, the strong cavity includes not only an interference effect obtained between the metal reflective layer and the emission layer but also the interference effect obtained between the emission layer and a metal thin film on the light-extraction side. In this case, an optical distance between the emission layer and the metal thin film on the light-extraction side is also designed so as to satisfy the $\lambda/4$ interference condition in such a manner that the interference effect becomes maximum. Therefore, in the strong cavity, the interference effect larger than that in the weak cavity can be used, and thus, the luminous efficiency can be improved remarkably.

However, it is known that, in the $\lambda/4$ interference condition, the distance between the emission layer and the metal reflective layer is about 60 nm or less, and hence surface plasmon (SP) loss becomes large. The SP loss is a phenomenon in which an SP of metal is excited by excitation energy of light emitting molecules, and as a result, the excitation energy is transformed into Joule heat. Therefore, the micro cavity using the $\lambda/4$ interference structure has a problem in that the luminous efficiency is not improved with respect to a large optical interference effect. Specifically, in order to further improve the luminous efficiency of the micro cavity under the $\lambda/4$ interference condition, a method of suppressing the SP loss is required.

Hitherto, as the method of suppressing the SP loss, a method of sacrificing the interference effect such as increasing the distance between the metal reflective layer and the emission layer (Japanese Patent Application Laid-Open No. 2008-543074) has been proposed. In recent studies, a method of satisfying both the interference effect of $\lambda/4$ and suppression of the SP loss, such as orienting a transition dipole moment of light emitting molecules horizontally (J. Frischeisen et al., Organic Electronics 12, (2011), 809-817) has started being proposed. Each of the proposals for suppressing the SP loss introduced in the foregoing has been investigated in a weak cavity construction having only one interface between a metal and a dielectric. In other words, no proposal for suppressing the SP loss in a strong cavity satisfying the $\lambda/4$ interference condition has been made yet.

SUMMARY OF THE INVENTION

An object of the present invention is to provide an organic EL element that suppresses SP loss even in a strong cavity construction satisfying a $\lambda/4$ interference condition thereby being improved in luminous efficiency, and various apparatuses each using the organic EL element.

An organic EL element of the present invention includes a first electrode formed of a metal layer, a first charge transport layer, an emission layer, a second charge transport layer, a second electrode formed of a metal layer, and an out-coupling layer in the stated order, the element causing light emitted by the emission layer to exit from a side of the second electrode, and the element emitting light having a maximum peak wavelength in an emission spectrum of 440 nm or more to 470 nm or less, in which: the first charge transport layer is in contact with the first electrode; the second charge transport layer and the out-coupling layer are each in contact with the second electrode; an optical path length L between a first interface between the first electrode and the first charge transport layer, and a second interface between the second electrode and the second charge transport layer satisfies the following relationship:

$$(-1-\phi/\pi) \times (\lambda/4) < L < (1-\phi/\pi) \times (\lambda/4)$$

where $\lambda$ represents the maximum peak wavelength, and $\phi$ represents a sum [rad] of phase shifts upon reflection of the light having the maximum peak wavelength $\lambda$ at the first interface and the second interface; and when a real part of a wavenumber of a surface plasmon generated at the first interface is represented by $k_r$ [rad/m] and a real part of a wavenumber of a surface plasmon generated at the second interface is represented by $k_s$[rad/m], the following relationship is satisfied:

$$-4.5\times10^6 \le k_r - k_s \le 2.1\times10^6.$$

In the present invention, a dipole component of a light emitting molecule that contributes to light extraction is extracted as propagating light to the outside without being absorbed by a surface plasmon, and hence an organic EL element with improved light extraction efficiency can be provided. Accordingly, the characteristics of a light emitting apparatus, an image forming apparatus, a display apparatus, and an imaging apparatus each constituted by using the organic EL element can be improved.

Further features of the present invention will become apparent from the following description of exemplary embodiments with reference to the attached drawings.

DESCRIPTION OF THE EMBODIMENTS

An organic EL element of the present invention is an organic EL element including a first electrode that is light-reflective, a second electrode that is light-transmissive, and an emission layer positioned between these electrodes, the element being provided with a strong cavity construction satisfying the λ/4 interference condition, and the element emitting blue light having a maximum peak wavelength in the range of 440 nm or more to 470 nm or less. Features of the present invention lie in that the first electrode and the second electrode each have a metal film, and that a wavenumber difference δk(Re) [rad/m] between surface plasmons (hereinafter referred to as "SPs") generated at the respective first and second electrodes is set to satisfy the following formula (III).

$$-4.5\times10^6 \le \delta k(Re) \le 2.1\times10^6 \qquad \text{Formula (III)}$$

Figure 1:
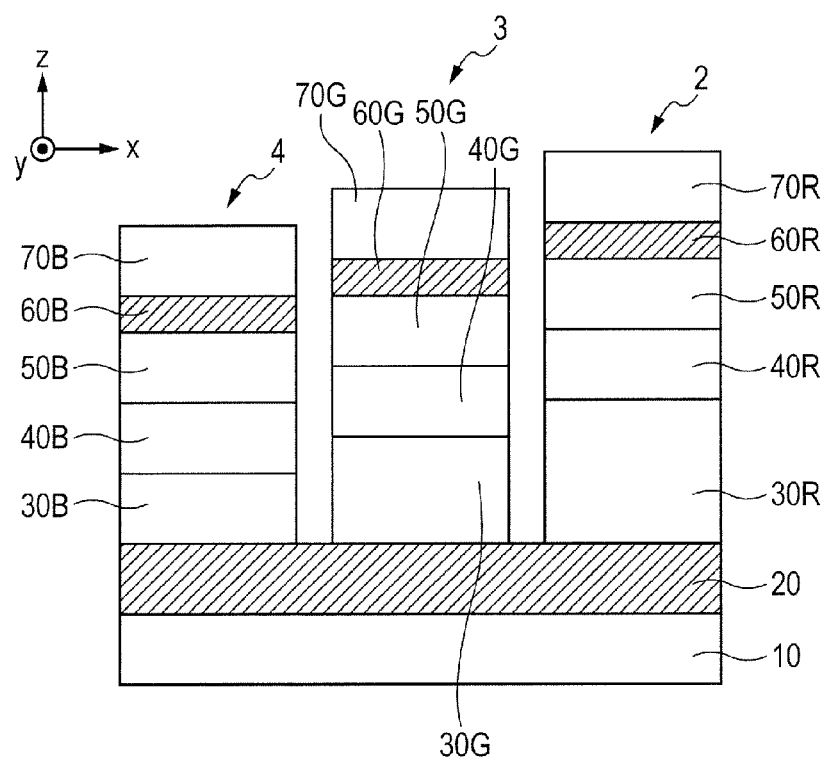
FIG. 1 is a sectional view schematically illustrating the construction of an organic EL element of the present invention.
Figure 2:
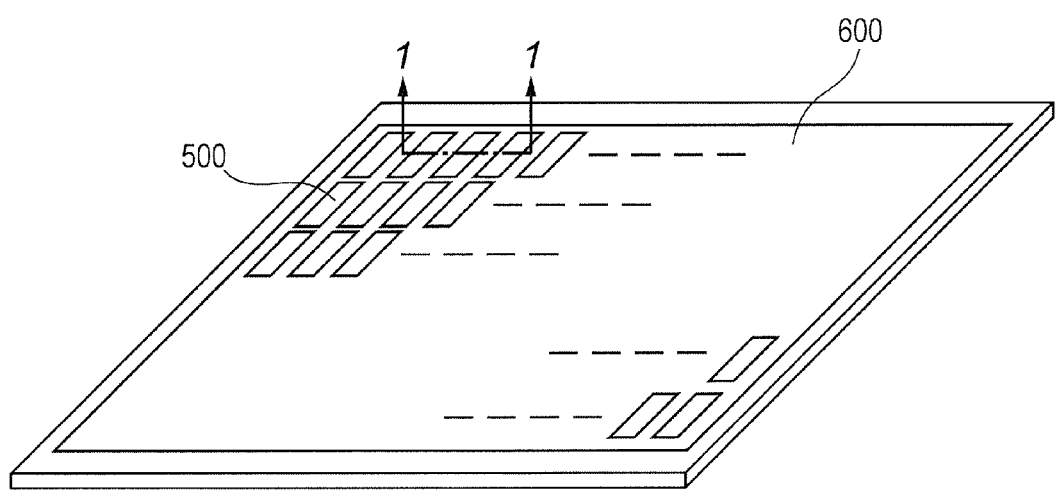
FIG. 2 is a perspective view schematically illustrating the construction of an embodiment of a display apparatus of the present invention.

Hereinafter, the organic EL element of the present invention is described by way of an embodiment. FIG. 1 is a sectional view schematically illustrating the construction of an embodiment of a display apparatus of the present invention. FIG. 2 is a perspective view of the embodiment of the display apparatus of the present invention and shows the section along the line 1-1 in FIG. 2 corresponds to FIG. 1.

The display apparatus of the present invention is provided with a display region 600 in which pixels 500 are placed in a matrix fashion, and each pixel 500 has an organic EL element. A display apparatus for displaying a full-color image typically has organic EL elements each emitting red (R), green (G), or blue (B) light. In FIG. 1, each of an organic EL element 2 that emits red light, an organic EL element 3 that emits green light, and an organic EL element 4 that emits blue light is formed on a substrate 10. Hereinafter, for convenience, the organic EL element that emits red light is described as an R element, the organic EL element that emits green light is described as a G element, and the organic EL element that emits blue light is described as a B element. In FIG. 1, a reflecting electrode 20 as the first electrode that is light-reflective is placed in each element on the substrate 10, and a transparent electrode 60R, 60G, or 60B as the second electrode that is light-transmissive is placed on the side opposite to the reflecting electrode 20 across an emission layer 40R, 40G, or 40B. In FIG. 1, reference symbols 30R, 30G, and 30B each represent a first charge transport layer, reference symbols 50R, 50G, and 50B each represent a second charge transport layer, and reference symbols 70R, 70G, and 70B each represent an out-coupling layer. It should be noted that R, G, and B of the respective symbols mean that the layers represented by the symbols are present in the R element 2, the G element 3, and the B element 4, respectively. In the following description, R, G, and B are omitted for convenience in description common to the respective elements. The example of FIG. 1 is of a top emission type in which light emitted by an organic EL element is extracted from the side of the transparent substrate 60 (the side opposite to the substrate 10). The present invention is applicable even to such a construction that light emitted by an organic EL element is caused to exit from the side of the substrate 10. It should be noted that a laminate formed of an organic compound interposed between the reflecting electrode 20 and the transparent electrode 60 is typically referred to as "organic compound layers". In addition, in FIG. 1, the reflecting electrode 20 is formed so as to be common to the R element, the G element, and the B element, and the transparent electrodes 60R, 60G, and 60B are formed for the R element, the G element, and the B element, respectively, provided that the reflecting electrode 20 may be formed for each of the R element, the G element, and the B element, and the transparent electrode 60R, 60G, or 60B may be formed so as to be common to the R element, the G element, and the B element.

As the substrate 10 in FIG. 1, a plastic substrate, various glass substrates, and a glass substrate on which a drive circuit such as a transistor formed of a semiconductor such as Poly-Si or a-Si (amorphous silicon) can be used. Further, a glass substrate in which a drive circuit is formed on a silicon wafer, the one in which a drive circuit is provided on a silicon wafer, or the like can also be used.

A hole injection layer, a hole transport layer, an electron blocking layer, a hole blocking layer, an electron transport layer, an electron injection layer, or the like is appropriately used as the first charge transport layer 30 or the second charge transport layer 50 depending on which one of the reflecting electrode 20 and the transparent electrode 60 serves as an anode or a cathode, and its positional relationship with the emission layer 40. In addition, two or more charge transport layers may be placed between the emission layer and an electrode.

In the present invention, an organic material in each layer is not limited. For example, each of a fluorescent material and a phosphorescent material may be used as a light emitting material for constituting the emission layer 40. A host material may be doped with the light emitting material. Further, at least one kind of compound except the light emitting material may be incorporated for improving the performance of the element. In addition, a hole transport layer may function as an electron blocking layer or a hole injection layer, and an electron transport layer may function as a hole blocking layer or an electron injection layer.

In the organic EL element of the present invention, an optical path length $L_r$ from a light emitting position to the reflecting surface of the reflecting electrode 20 (a first reflecting surface) and an optical path length $L_s$ from the light emitting position to the reflecting surface of the transparent electrode 60 (a second reflecting surface) are appropriately adjusted for obtaining an interference effect by a strong cavity. Specifically, the maximum peak wavelength in the spectrum of light emitted by the emission layer 40 is represented by $\lambda$, and phase shifts upon reflection of the light having the wavelength $\lambda$ at the first reflecting surface and the second reflecting surface are represented by $\phi_r$ and $\phi_s$ [rad], respectively. It should be noted that $\phi_r<0$ and $\phi_s<0$. Such optical path lengths $L_r$ and $L_s$ that the interference effect becomes the highest are represented by the following equations (1) and (2). It should be noted that the optical path lengths $L_r$ and $L_s$ are each the total sum of the product of a refractive index n of each layer of the organic compound layers included between the light emitting position and the reflecting surface, and a thickness d of the layer.

$$L_r=(-\phi_r/\pi)\times(\lambda/4) \tag{1}$$

$$L_s=(-\phi_s/\pi)\times(\lambda/4) \tag{2}$$

In summary, an optical path length L between the first reflecting surface and the second reflecting surface satisfies the following equation (A), provided that $\phi=\phi_r+\phi_s$. In addition, the first reflecting surface is an interface (first interface) between the reflecting electrode 20 as the first electrode and the first charge transport layer 30R, 30G, or 30B. In addition, the second reflecting surface is an interface (second interface) between the transparent electrode 60R, 60G, or 60B as the second electrode and the second charge transport layer 50R, 50G, or 50B.

$$L=(-\phi/\pi)\times(\lambda/4) \tag{A}$$

At this time, in an actual organic EL element, it is not necessarily needed to cause the lengths to strictly coincide with the thicknesses in consideration of, for example, a view angle characteristic in a trade-off relationship with the efficiency of extraction from a front surface. Specifically, each of the $L_r$ and the $L_s$ may have an error in the range of $\pm\lambda/8$ from the value satisfying the equation (1) or (2). Accordingly, in the organic EL element of the present invention, the following formulae (I) and (II) are preferably satisfied.

$$(-1-2\phi_r/\pi)\times(\lambda/8)<L_r<(1-2\phi_r/\pi)\times(\lambda/8) \quad\text{Formula (I)}$$

$$(-1-2\phi_s/\pi)\times(\lambda/8)<L_s<(1-2\phi_s/\pi)\times(\lambda/8) \quad\text{Formula (II)}$$

As a combination of the formulae (I) and (II), in the organic EL element of the present invention, the following formula (B) is preferably satisfied.

$$(-1-\phi/\pi)\times(\lambda/4)<L<(1-\phi/\pi)\times(\lambda/4) \quad\text{Formula (B)}$$

More specifically, because the values of $\phi_r$ and $\phi_s$ each approximately equal $-\pi$, assuming $\phi=\phi_r+\phi_s=(-\pi)+(-\pi)=-2\pi$, in the organic EL element of the present invention, the following formula (B') is preferably satisfied.

$$\lambda/4<L<3\lambda/4 \quad\text{Formula (B')}$$

When this formula is satisfied, a physical distance between the first interface and second intersurface of the organic EL element is 58 nm or more to 186 nm or less.

More preferably, $L_r$ and $L_s$ each fall within the range of $\pm\lambda/16$ from the value satisfying the equation (1) or (2), and in the organic EL element of the present invention, preferably satisfy the following formulae (I') and (II').

$$(-1-4\phi_r/\pi)\times(\lambda/16)\leq L_r\leq(1-4\phi_r/\pi)\times(\lambda/16) \quad\text{Formula (I')}$$

$$(-1-4\phi_s/\pi)\times(\lambda/16)\leq L_s\leq(1-4\phi_s/\pi)\times(\lambda/16) \quad\text{Formula (II')}$$

As a combination of the formulae (I') and (II'), in the organic EL element of the present invention, the following formula (C) is preferably satisfied.

$$(-1-2\phi/\pi)\times(\lambda/8)\leq L\leq(1-2\phi/\pi)\times(\lambda/8) \quad\text{Formula (C)}$$

More specifically, because the values of $\phi_r$ and $\phi_s$ each approximately equal $-\pi$, assuming $\phi=\phi_r+\phi_s=(-\pi)+(-\pi)=-2\pi$, in the organic EL element of the present invention, the following formula (C') is preferably satisfied.

$$3\lambda/8\leq L\leq 5\lambda/8 \quad\text{Formula (C')}$$

When this formula is satisfied, the physical distance between the first interface and second interface of the organic EL element is 87 nm or more to 155 nm or less.

In the case of an element structure satisfying the conditions (I) and (II), an interaction between the SP of the reflecting electrode 20 and the SP of the transparent electrode 60 is significant because the thickness of the organic compound layers is about 100 nm. In the present invention, the luminous efficiency of the B element is improved by suppressing the SP loss of a dipole component in the in-plane direction of the substrate of a blue $\lambda/4$ strong cavity that emits light having a peak wavelength of 440 nm or more to 470 nm or less. More specifically, constituent materials for the reflecting electrode 20 and the transparent electrode 60, and the complex dielectric constants (or complex refractive indices) of the hole transport layer, the electron transport layer, and the out-coupling layer each joined to any such electrode are selected so that the wavenumbers of the SPs generated at the reflecting electrode 20 and the transparent electrode 60 may substantially coincide with each other.

Hereinafter, the embodiment of the present invention is described while a combination of a reflecting electrode species and a transparent electrode species in the λ/4 strong cavity, and the result of the analysis of dependence on the dielectric constant (refractive index) of the charge transport layer or out-coupling layer joined to any such electrode are shown for a specific combination of modes for the suppression of the SP loss.

Described in the following description is the case where the reflecting electrode 20 is an anode (the transparent electrode 60 is a cathode) and the first charge transport layer 30 is a hole transport layer (the second charge transport layer 50 is an electron transport layer), provided that the present invention is independent of the polarity of an electrode and establishes itself even in the case where the reflecting electrode 20 is a cathode and the transparent electrode 60 is an anode.

Described first is that such a combination of materials that luminous efficiency is highest in the element structure of the B element satisfying the formulae (I) and (II) is different from those in any other luminescent color and any other construction. Table 1 shows the anode species dependence of a relationship among luminous efficiency η, a cavity intensity $\Psi_{cav}$, and an SP loss ratio ξ in each element construction. Here, Al and Ag as representative metals each having a good reflectance (>87%) in the entire visible light region are compared. An organic EL element investigated here is of such top emission type as illustrated in FIG. 1, and is of a structure "substrate/anode/hole transport layer (HTL)/emission layer (EML)/electron transport layer (ETL)/cathode/out-coupling layer (OCL)". The anodes of organic EL elements 101 and 102 are Ag and Al, respectively. In addition, b, r, and g after 101 or 102 represent the B element, the R element, and the G element, respectively, and the same holds true for an organic EL element 103 or later to be described later.

A simulation was performed by the same technique as that of S. Nowy et al., Journal of Applied Physics, Vol. 40, (2008), 123109. The PL spectra of the R element, the G element, and the B element used in calculation are the PL spectra of Ir(piq)$_3$, Alq$_3$, and DAC below, respectively. Ir(piq)$_3$: Tris[1-phenylisoquinoline-C2, N]iridium(III) Alq$_3$: Tris(8-quinolinolato)aluminum DAC: 2,8-Diaminochrysene Hereinafter, the PL spectrum of DAC is used in the B element unless otherwise stated. In addition, the calculation was performed while the (exciton production efficiencies, internal quantum efficiencies) of the R element, the G element, and the B element were set to (75%, 50%), (25%, 85%), and (25%, 80%), respectively. A light emission distribution in the simulation is assumed to be a uniform distribution. In addition, the thickness of the emission layer is fixed to 20 nm in all element constructions, and the thicknesses of the hole transport layer, the electron transport layer, and the out-coupling layer are optimized for the element of each color so that its luminous efficiency may be maximum. The thicknesses of the hole transport layer and the electron transport layer satisfy the relationships of the formulae (I) and (II). In addition, n and d in the table represent a refractive index and a thickness [nm] at λ, respectively.

The cavity intensity $\Psi_{cav}$ defined here represents the extent to which the PL spectrum is amplified by a multiple interference effect. In other words, when the SP loss is not taken into consideration, front surface luminance increases as the cavity intensity increases. The cavity intensity $\Psi_{cav}$ has the relationship of the following equation (3).

$$\Psi_{cav} = \int_{\lambda_1}^{\lambda_2} X(\lambda) \cdot \Omega(\lambda) \, d\lambda \quad (3)$$

$$X(\lambda) = \left| \frac{1 + \sqrt{R_1} \, e^{i\left(\frac{\phi_1}{2\pi} + \frac{4\pi n_e L_r}{\lambda}\right)}}{1 + \sqrt{R_1}\sqrt{R_2} \, e^{i\left(\frac{(\phi_1 + \phi_2)}{2\pi} + \frac{4\pi(n_r L_r + n_s L_s)}{\lambda}\right)}} \right|^2 T_c \quad (4)$$

In the equation, X represents the extent to which the electric field of light generated in the cavity is amplified on a light extraction side, and is defined by the equation (4). The component in the absolute-value sign of the equation (4) represents the extent of strengthening interference in a light extraction direction in a light emitting region, and $T_c$ represents a transmittance in the light extraction direction when viewed from the emission layer. In the component in the absolute-value sign of the equation (4), $R_1$ and $R_2$ represent the reflectances of the first electrode and the second electrode, respectively, and $\phi_1$ and $\phi_2$ represent phase shift amounts at the first electrode and the second electrode, respectively. $n_r$ and $n_s$ represent an effective refractive index between the hole transport layer and the emission layer, and an effective refractive index between the electron transport layer and the emission layer, respectively. Ω represents an emission spectrum intensity normalized so that the peak intensity may be 1.

In addition, the SP loss ratio ξ is a figure of merit indicating a reduction in luminous efficiency due to SP absorption. The SP loss ratio ξ is a ratio of an energy $W_{sp}$ [W] (a coupling rate $\Gamma_{sp}$) coupled with a surface plasmon to an energy $W_{1c}$ [W] (or radiation rate $\Gamma_{1c}$) of light radiated in a light cone, and is defined as the following equation (5).

$$\xi = \frac{w_{sp}}{w_{1c}} = \frac{\gamma_{sp}}{\gamma_{1c}} \quad (5)$$

The observation of an effect of an anode species on the organic EL element 101 or 102 having an element structure satisfying the formulae (I) and (II) reveals that only the B element (101b or 102b) shows a different tendency. Specifically, comparison between the R elements 101r and 102r (or the G elements 101g and 102g) showed that there was a small correlation between the luminous efficiency η and the SP loss ratio ξ, and confirmed such a large correlation that a structure having a higher cavity intensity had higher luminous efficiency. Meanwhile, comparison between the B elements

TABLE 1

| Element | Anode | HTL n | HTL d [nm] | ETL n | ETL d [nm] | Cathode material | Cathode d [nm] | OCL n | OCL d [nm] | η [cd/A] | CIE_Yxy [Arbi. Uni.] | $\Psi_{cav}$ [10^-6] | ξ [Arbi. Uni.] |
|---|---|---|---|---|---|---|---|---|---|---|---|---|---|
| 101b | Ag | 1.88 | 23 | 1.88 | 35 | Ag | 26 | 1.88 | 65 | 3.2 | (0.136, 0.065) | 1.27 | 3.00 |
| 102b | Al | 1.88 | 31.5 | 1.88 | 35 | Ag | 26 | 1.88 | 65 | 4.1 | (0.137, 0.066) | 1.17 | 1.94 |
| 101r | Ag | 1.74 | 59.5 | 1.74 | 50 | Ag | 26 | 1.74 | 110 | 45.2 | (0.666, 0.333) | 2.52 | 2.06 |
| 102r | Al | 1.74 | 67 | 1.74 | 50 | Ag | 26 | 1.74 | 110 | 29.1 | (0.666, 0.334) | 1.73 | 1.94 |
| 101g | Ag | 1.78 | 42.5 | 1.78 | 45 | Ag | 26 | 1.78 | 75 | 33.9 | (0.294, 0.670) | 2.50 | 1.48 |
| 102g | Al | 1.78 | 50.3 | 1.78 | 45 | Ag | 26 | 1.78 | 75 | 30.9 | (0.295, 0.664) | 2.09 | 1.23 |
| 103b | Ag | 1.88 | 152 | 1.88 | 35 | Ag | 26 | 1.88 | 65 | 3.2 | (0.128, 0.066) | 0.76 | 2.16 |
| 104b | Al | 1.88 | 161 | 1.88 | 35 | Ag | 26 | 1.88 | 65 | 2.9 | (0.129, 0.066) | 0.70 | 2.22 |

101*b* and 102*b* provided the following result. Such correlation between front surface luminous efficiency and the cavity intensity as observed in the G or R element was small, and the luminous efficiency was improved in the element 102*b* having smaller SP loss.

The B element 103*b* or 104*b* the thickness of the hole transport layer of which was optimized to satisfy the following equation (6) was also investigated as a comparative example.

$$L_r = (2 - (\phi_r/\pi)) \times (\lambda/4) \quad (6)$$

As a result of comparison between the B elements 103*b* and 104*b*, a clear correlation between the luminous efficiency and the cavity intensity was observed, and the luminous efficiency was improved in the element 103*b* having a higher cavity intensity.

It can be said from the foregoing that such relationship between the luminous efficiency and the SP loss ratio as observed in the B element 101*b* or 102*b* is attributable to an element structure satisfying the formulae (I) and (II). In the B element having an element structure satisfying the formulae (I) and (II) as described above, the SP loss is found to be an important parameter that determines its luminous efficiency. In other words, the foregoing suggests that such combination of materials that the luminous efficiency is highest is different from those in any other construction and any other luminescent color.

The present invention is a proposal concerning an element parameter for an improvement in luminous efficiency by the suppression of the SP loss unique to the B element having an element structure satisfying the formulae (I) and (II). Hereinafter, the mechanism via which the SP loss is suppressed of the present invention is described in detail while the B element 102*b* having an element structure satisfying the requirements specified in the present invention and the B element 101*b* having an element structure that does not satisfy the requirements are compared.

It is generally known that the excitation rate of an SP has the relationship of the following formula (7) (see I. Gontijo et. al., Physical Review B, Vol. 60, (1999), 11,564).

$$\Gamma_{sp} \propto \langle \vec{p} \cdot \vec{E}_{sp} \rangle^2 \rho(\omega) \quad (7)$$

In the formula, p represents a transition dipole moment, $E_{sp}$ represents an electric field vector generated by the SP, and $\rho$ represents the density of state (DOS) of the SP. < > represents the thermodynamic average. It can be understood from the formula (7) that the ease with which the SP is excited is proportional to the square of the inner product of the electric field $E_{sp}$ of the SP and the transition dipole moment p.

Here, a z direction is defined as a substrate normal direction (light extraction direction). Of the components in in-plane direction of the substrate, a x direction is defined as a direction parallel to a vibration axis of the transition dipole moment, and a y direction is defined as a direction perpendicular to the vibration axis. According to the definition, an electric field vector of TM mode (Transverse Magnetic mode), which is a waveguide mode free of any magnetic field component in the propagation direction of a wave, is constituted by two components of the x direction and the z direction. The SP mode is included in the TM mode category, and therefore the electric field vectors of SP are the x direction and the z direction components. The TE mode (Transverse Electric mode) is a waveguide mode free of any electric field component in the propagation direction of the wave. In other words, the electric field of the TE mode is constituted by the x direction component and propagates in a y direction.

Meanwhile, component which is extracted as propagating light to the outside is only component of in-plane direction of the substrate (direction perpendicular to the thickness direction of the emission layer) of the transition dipole moment in terms of the nature of the radiation pattern of the transition dipole moment. Accordingly, the suppression of the SP absorption for the x component of the transition dipole moment is effective for an improvement in luminous efficiency by the suppression of the SP absorption. The concept of the present invention is to optimize the surface plasmons of the anode and the cathode so that the in-plane direction component (in other words, x component) of the electric field generated by an SP in the emission layer may be small.

Figure 3:
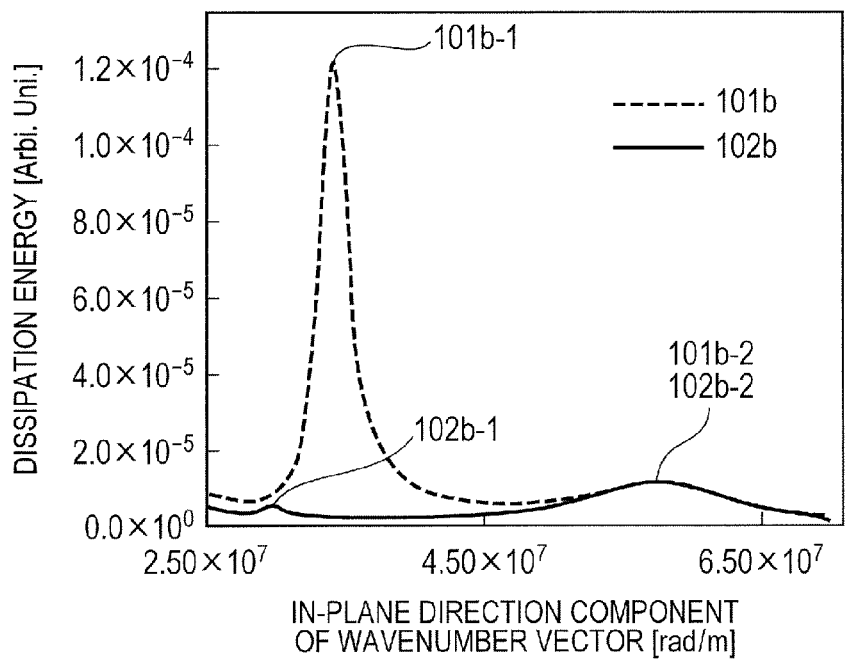
FIG. 3 is a diagram showing the SP energy dissipation of an x component of each of organic EL elements 101b and 102b that emit blue light in the embodiment of the present invention.
Figure 4:
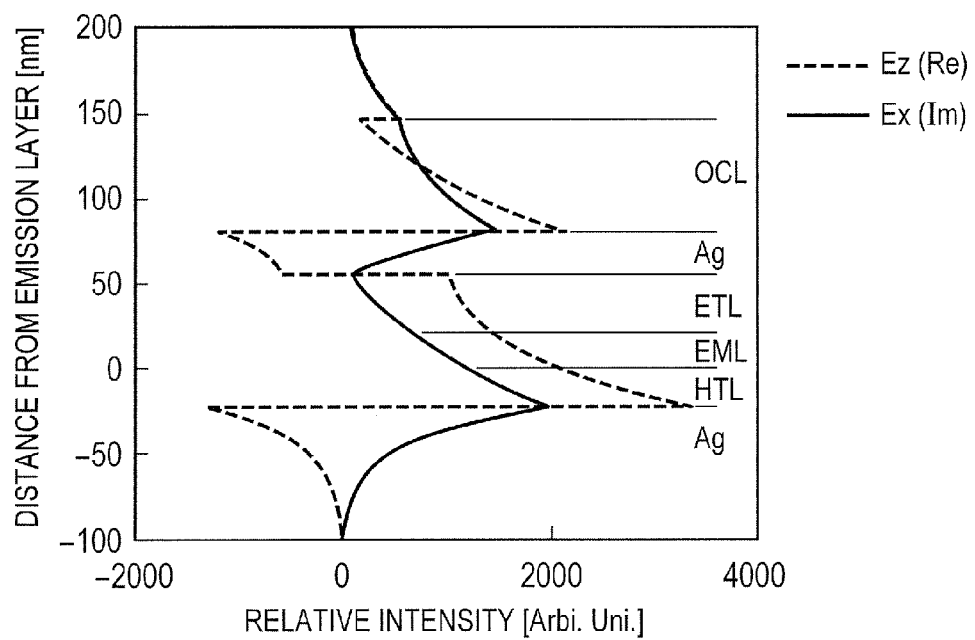
FIG. 4 is an electric field profile of an SP mode 101b-1 shown in FIG. 3.
Figure 5:
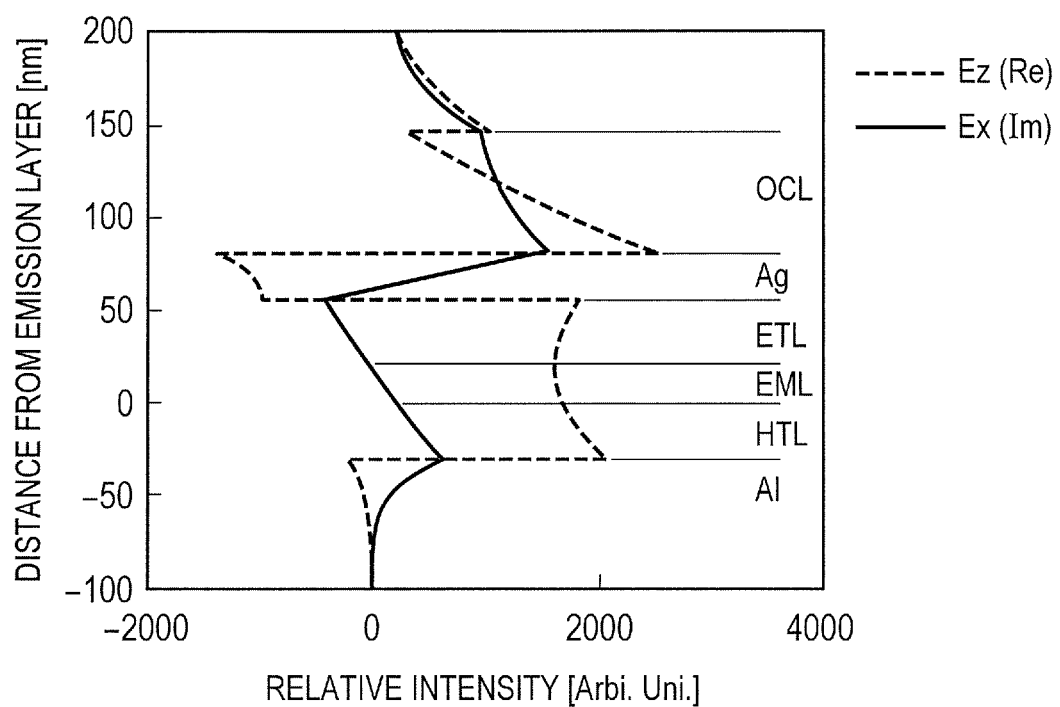
FIG. 5 is an electric field profile of an SP mode 102b-1 shown in FIG. 3.

FIG. 3 shows a relationship between the SP energy dissipations of the x components in the B elements 101*b* and 102*b* at a frequency (4.12×10$^{15}$ [rad/sec]) at the peak wavelength of light emitted by each organic EL element. Table 1 shows an element structure. It can be understood from FIG. 3 that two modes are generated in the SP generated in the B element 101*b* or 102*b*. One of the modes is a mode generated at around 3.0×10$^7$ [rad/m] (101*b*-1 or 102*b*-1) and the other is a mode generated at around 5.6×10$^7$ [rad/m] (101*b*-2 or 102*b*-2). Comparison between the modes 101*b*-1 and 102*b*-1 showed clear anode species dependence. Causing the figure and the SP loss ratio in Table 1 to correspond to each other shows that large SP loss observed in the B element 101*b* is attributable to the mode 101*b*-1. FIG. 4 and FIG. 5 show the electric field profiles of the modes 101*b*-1 and 102*b*-1, respectively. The calculation was performed by a transfer matrix method. In each of both FIG. 4 and FIG. 5, the SPs of the anode and the cathode are not independent of each other but are in a mixing state. Here, the SPs in a state of causing the mixing are referred to as "gap plasmon". Comparison between the element 101*b* in which absorption by the gap plasmon is large (the mode 101*b*-1 of FIG. 3) and the element 102*b* in which the absorption is small (the mode 102*b*-1 of FIG. 3) shows that the x component of the electric field generated by the gap plasmon in the B element 102*b* is substantially zero. In other words, it can be said that the B element 102*b* is of an element structure in which the inner product of the $p_x$ and the $E_{sp}$ is zero.

Next, what relationship between the SPs of the anode and the cathode can suppress the absorption by the gap plasmon like FIG. 5 is described.

In general, the wavenumber of an SP generated at an interface between a metal having an optically infinitely large thickness and an organic compound layer has the relationship of the following equation (8).

$$k_{sp} = \sqrt{\frac{\varepsilon_a \cdot \varepsilon^r_{org}}{\varepsilon_a + \varepsilon^r_{org}}} \, k_0 \approx \sqrt{\frac{\varepsilon_a \cdot (n^r_{org})^2}{\varepsilon_a + (n^r_{org})^2}} \, k_0 \quad (8)$$

In the equation, $\varepsilon_a$ represents the complex dielectric constant of the metal (anode), $\varepsilon^r_{org}$ represents the effective complex dielectric constant of the organic compound layer, and $k_0$ represents the wavenumber of light in the air. Here, the extinction coefficient of the organic compound layer is set to zero for simplicity. In other words, when the refractive index of the organic compound layer is represented by $n^r_{org}$, the relationship of $\varepsilon^r_{org} \approx (n^r_{org})^2$ is established. In other words, the wavenumber of the SP generated at the anode is determined by the complex dielectric constant $\varepsilon_a$ of the anode and the effective complex dielectric constant $\varepsilon^r_{org}$. For information, the effective complex dielectric constant $\varepsilon^r_{org}$, which is determined by the dielectric constant of a hole transport layer, an emission layer, an electron transport layer, or the like, or the thicknesses of each layer, is dominated by the dielectric constant of the hole transport layer joined to the anode.

On the other hand, in the case of a metal having an optically finite thickness, the wavenumber is determined by a complex dielectric constant $\in_c$ and thickness d of the metal (cathode), an effective complex dielectric constant $\in^s_{org}$ of the organic compound layer on the side of an electron transport layer, and an effective complex dielectric constant $\in^s_{ocl}$ on the side of an out-coupling layer (see the equation (6) and equation (7) of J. J. Burke et. al., Physical Review B, Vol. 33, (1986), 5,186. for details). As in the case of the anode, the effective complex dielectric constant $\in^s_{Org}$ of the organic compound layer on the side of the electron transport layer and the effective complex dielectric constant $\in^s_{ocl}$ on the side of the out-coupling layer are dominated by the dielectric constants of the electron transport layer and the out-coupling layer joined to the cathode, respectively.

In addition, a complex dielectric constant (or a complex refractive index) can be measured with a commercially available spectroscopic ellipsometer employing known ellipsometry that is a method involving observing a change in state of polarization upon reflection of light at the surface of a substance to determine the optical constant of the substance. Then, the peak wavenumber of the SP of the reflecting electrode 20 or the transparent electrode 60 can be calculated. In a panel, they are determined through the use of the ellipsometry in combination with a cross-section scanning electron microscope (SEM), secondary ion spectrometry (SIMS), an X-ray reflectivity method, and the like. Based on the thicknesses and dielectric constants of an anode, a cathode, and an organic compound layer determined by those analyses, a relationship between the wavenumbers of the SPs of the anode and the cathode can be specified.

Figure 6A:
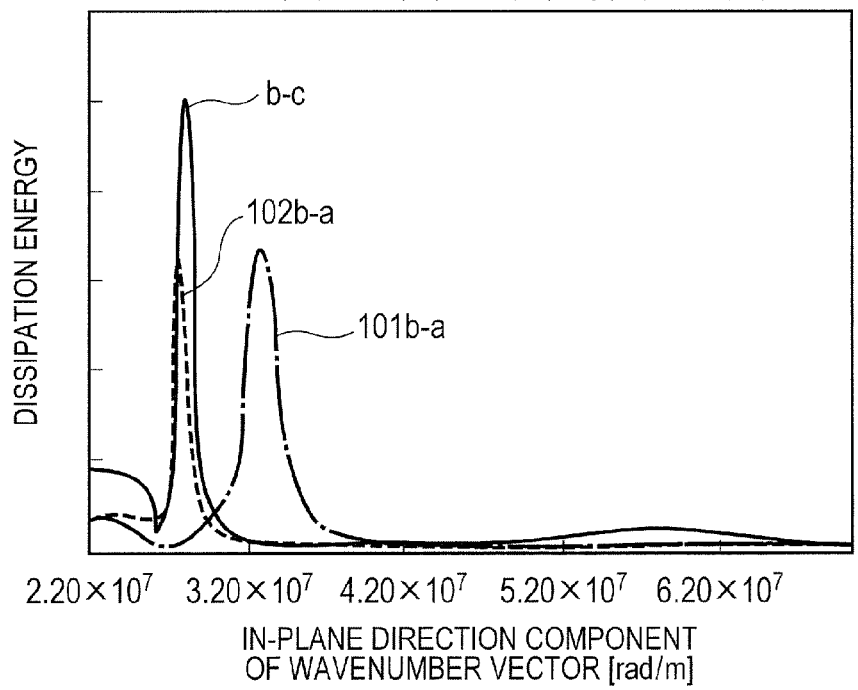
FIGS. 6A and 6B are diagrams showing the SP energy dissipations of the anodes and cathodes of the organic EL elements 101b and 102b that emit blue light in the embodiment of the present invention.
Figure 6B:
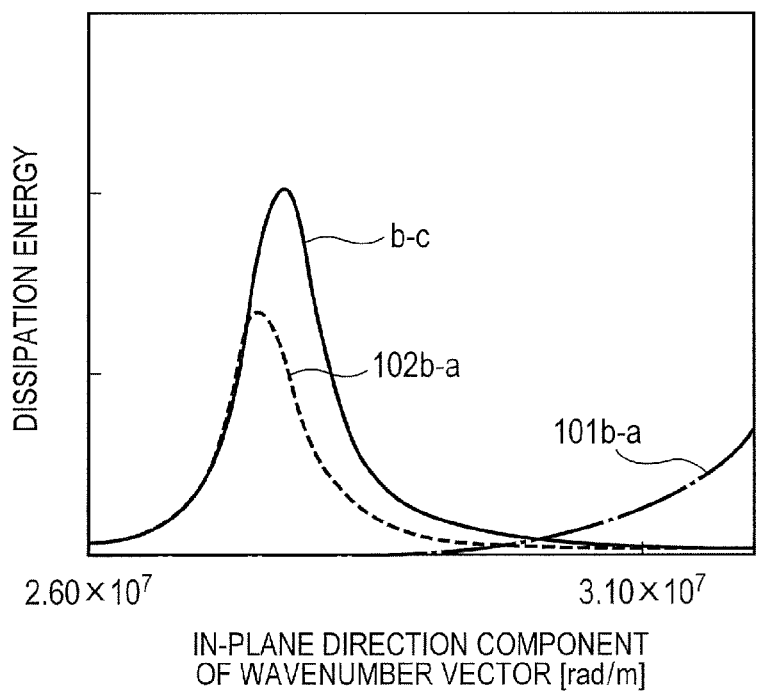
Figure 11:
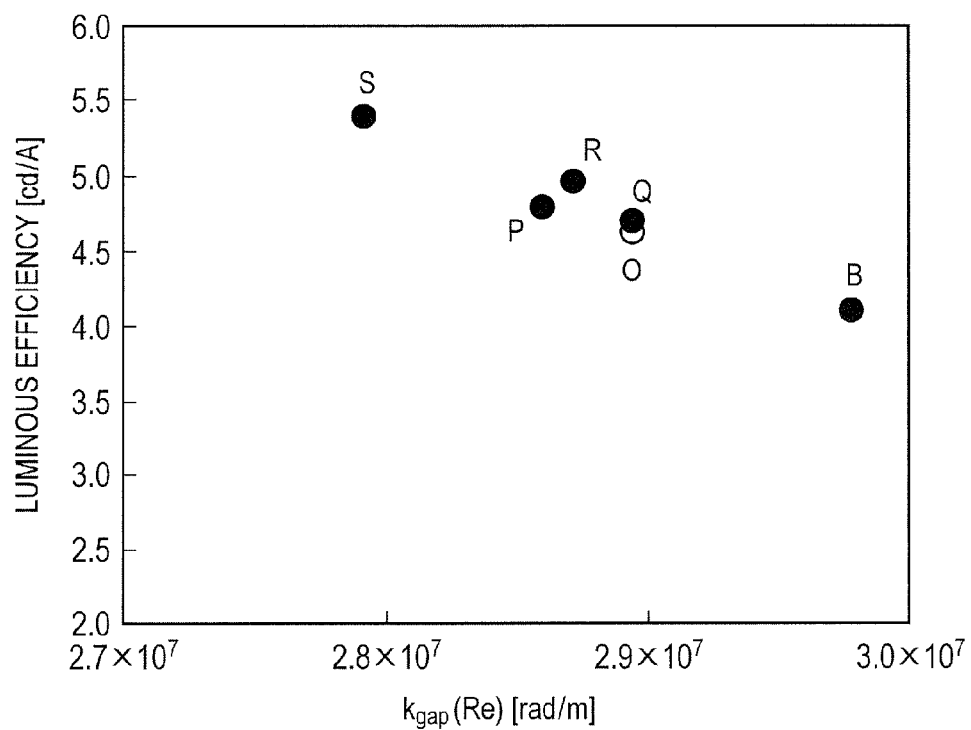
FIG. 11 is a diagram showing a relationship between the wavenumber of a gap plasmon and luminous efficiency.

FIGS. 6A and 6B each show a relationship among the SPs of an Ag cathode, an Ag anode, and an Al anode constituting the B elements 101b and 102b. It should be noted that FIG. 6B is a partially enlarged view of FIG. 6A. The calculation was performed at a frequency ($4.12 \times 10^{15}$ [rad/sec]) at the peak wavelength of photoluminescence spectrum. In the calculation of the wavenumber of the SP of an anode, the thickness of an electron transport layer was set to infinity in order that an influence of the cathode was eliminated. Similarly, the thickness of a hole transport layer was set to infinity in the case of the calculation of the wavenumber of the SP of the cathode. The axes of ordinate shown in FIGS. 6A and 6B are each normalized so that the wavenumber of the SP of the cathode may be large for convenience in emphasizing the peak wavenumbers of the anode and the cathode. It can be understood from FIGS. 6A and 6B that the wavenumber of an SP generated at an interface between a hole transport layer having a refractive index n of 1.88 and an Ag substrate (101b-a in the figures) is larger than that of an SP generated at an interface between the hole transport layer and Al (102b-a in the figures). This is attributable to the fact that the plasma frequency of Ag is smaller than that of Al and hence the real part of the complex dielectric constant of Ag has a smaller absolute value than that of Al. Meanwhile, the SP of the Ag cathode (b-c in the figures) is split into two SPs, which are generated at $2.8 \times 10^7$ and $5.7 \times 10^7$ [rad/m]. The former is called an LRSP and the latter is called an SRSP, and the SPs are modes as a result of an interaction between SPs at two interfaces, i.e., an interface between the Ag cathode and the out-coupling layer, and an interface between the cathode and the electron transport layer (see L. H. Smith et. al., Journal of Modern Optics, Vol. 55, (2008), 2,929. or J. J. Burke et. al., Physical Review B, Vol. 33, (1986), 5,186). The term "LRSP" means a long-range surface plasmon and the term "SRSP" means a short-range surface plasmon. It can be understood from FIGS. 6A and 6B that the wavenumbers of the SP of the Al anode and the LRSP of the Ag cathode coincide with each other. In other words, the foregoing suggests that causing the wavenumbers of the anode and the cathode to substantially coincide with each other can set the electric field in the in-plane direction in the emission layer to zero as shown in FIG. 5. As described later, the SP of the cathode with which the SP of the anode is caused to substantially coincide is more desirably an LRSP than an SRSP. The wavenumbers that the LRSP and the SRSP may have are $2.2 \times 10^7$ to $3.5 \times 10^7$ [rad/m] and $4.5 \times 10^7$ to $2.5 \times 10^8$ [rad/m], respectively. Therefore, the wavenumber of a gap plasmon can be reduced by adopting such a design that the SP of the anode is caused to substantially coincide with the LRSP of the cathode. A reduction in the wavenumber of the gap plasmon can contribute to a reduction in DOS and a reduction in the excitation rate of the gap plasmon. FIG. 11 shows the effects. Hereinafter, the SP of the cathode refers to the LRSP unless otherwise stated.

Next, what range of the wavenumber difference between the anode and the cathode a gap plasmon is easily suppressed in, and a combination of the anode and the cathode by which the gap plasmon is easily suppressed are described.

Figure 7:
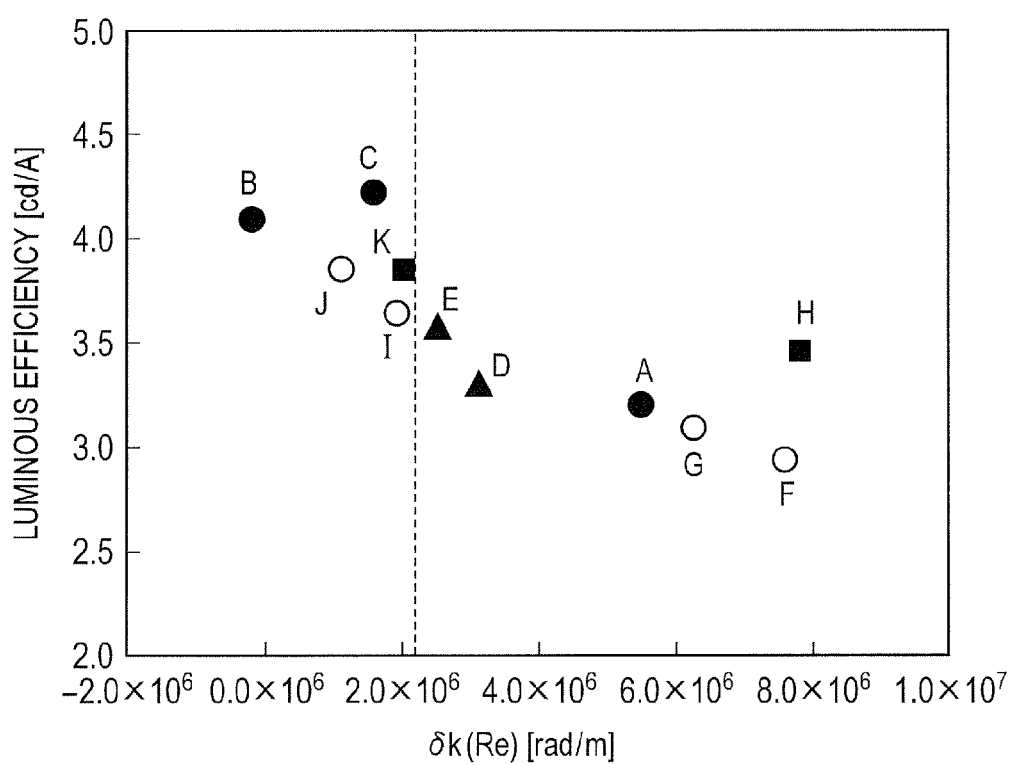
FIG. 7 is a diagram showing a relationship between an SP wavenumber difference δk(Re) between an anode and a cathode, and luminous efficiency when a refractive index n of an out-coupling layer equals 1.88.
Figure 8:
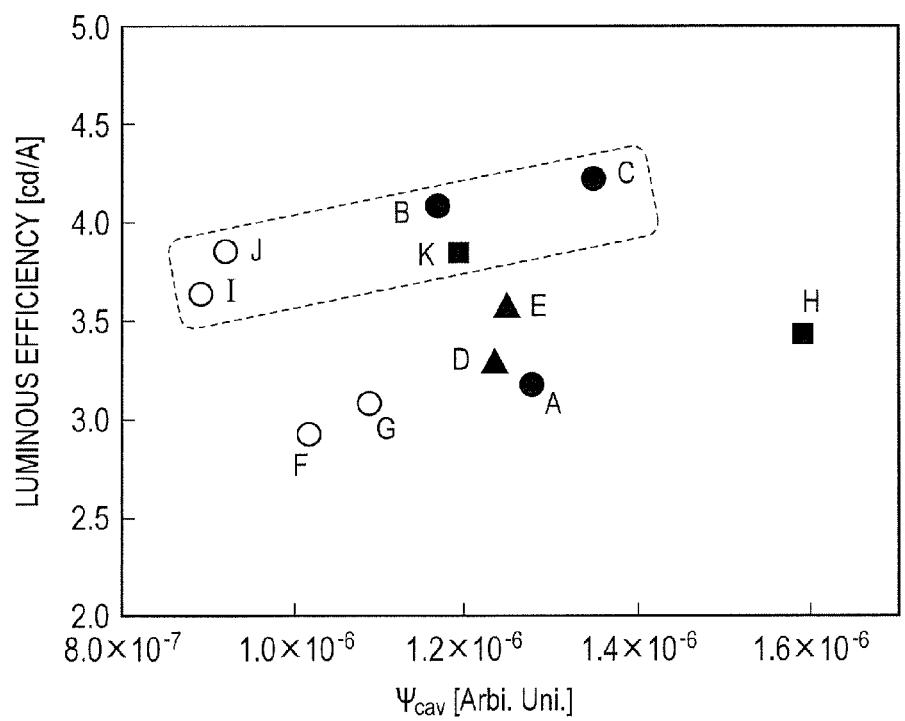
FIG. 8 is diagram showing a relationship between a cavity intensity and the luminous efficiency when the refractive index n of the out-coupling layer equals 1.88.

FIG. 7 shows a relationship between the SP wavenumber difference δk(Re) between the anode and the cathode, and luminous efficiency, and FIG. 8 shows a relationship between the cavity intensity defined by the equation (3) and the luminous efficiency. Here, the wavenumber difference δk(Re) satisfies the relationship of δk (Re)=$k^a_{sp}$(Re)−$k^c_{sp}$(Re), where $k^c_{sp}$(Re) represents the real part of the SP wavenumber of the anode and $k^c_{sp}$(Re) represents the real part of the SP wavenumber of the cathode. As determined in FIGS. 6A and 6B, the value for the SP wavenumber of the anode (or the cathode) is determined by the transfer matrix method on condition that the thickness of the electron transport layer (the hole transport layer in the case of the cathode) is sufficiently large. Each element construction investigated here is of a structure "substrate/anode/hole transport layer (HTL)/emission layer (EML)/electron transport layer (ETL)/cathode/out-coupling layer (OCL)". The dielectric constants (or refractive indices) of an organic compound layer and the out-coupling layer, and their dispersion characteristics in this investigation are identical to those of the B elements 101b and 102b in Table 1. In addition, the thicknesses of the hole transport layer, the electron transport layer, the cathode, and the out-coupling layer are optimized so that the luminous efficiency at chromaticity coordinates CIE_Yxy of (0.136, 0.66) may be maximum to such an extent that the formulae (I) and (II) are satisfied.

Reference is made to the value described in Handbook of Optical Constants of Solids (Academic Orlando Fla. 1985) for the optical constant of Mg used here, and an Mg anode produced by a sputtering method is assumed (see U.S. Pat. No. 5,022,726 for a difference between the optical characteristics of Mg anodes formed by a deposition method (resistance heating) and the sputtering). The SP wavenumber of a metal laminate anode can be controlled depending on the thickness of an upper metal. The SP wavenumber of an Ag/Mg laminate anode can be made smaller than that of Ag by increasing the thickness of Mg while holding its reflectance. An Mg:Ag alloy used in the cathode was an Ag-rich (10:1) one absorbing a small quantity of propagating light (see Japanese Patent Application Laid-Open No. 2003-109775). Here, its SP wavenumber is controlled by changing the content of Mg in the cathode as follows: MgAg cathode→MgAg/Ag cathode→Ag cathode.

First, as can be seen from FIG. 7, there was a clear correlation between the luminous efficiency and the wavenumber difference δk(Re), and such a tendency that the luminous efficiency became higher as the δk(Re) reduced was obtained. On the other hand, FIG. 8 shows no correlation between the luminous efficiency and the cavity intensity. In other words, it can be said that a main factor that determines the luminous efficiency of a B element is not the cavity intensity but the SP wavenumber difference δk(Re) between the anode and the cathode. Comparison among constructions A to E in FIG. 7 and FIG. 8 corresponds to the case where the SP wavenumber of the anode is changed. First, the observation of anode species dependence in comparison among the constructions A to C shows that a plasma frequency $\omega_p$ of the anode is an important factor. In other words, Ag having a small plasma frequency ($\omega_p=14.0\times10^{15}$ s$^{-1}$) results in a large δk(Re) and low luminous efficiency as compared with Mg ($\omega_p=16.1\times10^{15}$ s$^{-1}$) and Al ($\omega_p=23.2\times10^{15}$ s$^{-1}$). Next, comparison among the constructions A, D, and E shows that the δk(Re) becomes smaller and the luminous efficiency becomes higher as the thickness of Mg increases. As described above, such a tendency that the luminous efficiency became higher as the δk(Re) reduced was obtained except for a relationship between the construction B and the construction C. For information, that the luminous efficiency of the construction C is higher than that of the construction B is attributable to the fact that the cavity intensity of the construction C is higher than that of the construction B. Next, as can be seen from cathode dependence in the Al anode (comparison among the constructions B and I to K), it can be said that the δk(Re) is desirably reduced. Specifically, the construction B has higher luminous efficiency than that of the construction K having a larger cavity intensity. The foregoing determination can also be made from the fact that the luminous efficiency of the construction H having the highest cavity intensity is lower than that of the construction I having the lowest cavity intensity.

A desired upper limit for the δk(Re) in the present invention is specifically set so that luminous efficiency at the value may be lower than the maximum luminous efficiency by 15% or more. As indicated by a broken line in FIG. 7, a specific value therefore is desirably as follows: δk(Re)≤2.1×10$^6$ [rad/m]. This corresponds to a region enclosed by a dotted line in FIG. 8. In the region, a material has only to be selected so that the cavity intensity may be high as in a conventional design guideline.

Next, a lower limit for the δk(Re) is described. In ordinary cases, the wavenumber of the LRSP generated at the cathode is often smaller than that of the SP generated at the anode. The foregoing can be understood from the fact that the δk(Re) is minimum in a combination of Al as the anode and Ag as the cathode.

Figure 9:
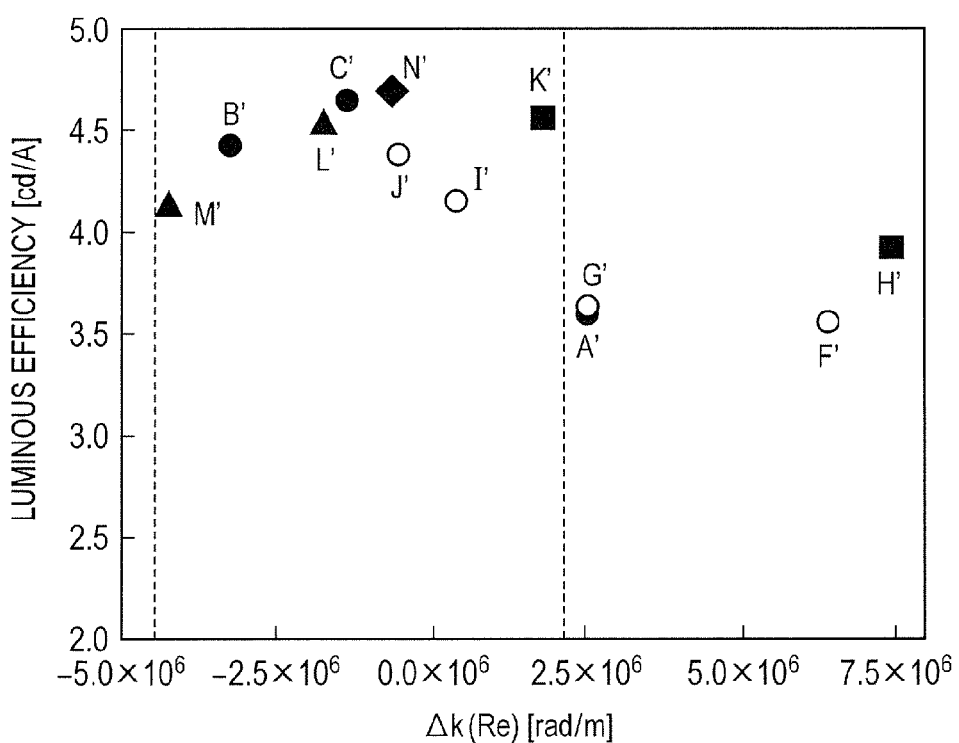
FIG. 9 is diagram showing a relationship between the SP wavenumber difference δk(Re) between the anode and the cathode, and the luminous efficiency when the refractive index n of the out-coupling layer equals 2.4.

In the case where a high-dielectric constant material such as ZnSe is used in the out-coupling layer, however, the δk(Re) can be negative because the wavenumber of the LRSP of the cathode increases. FIG. 9 shows a relationship between the δk(Re) and luminous efficiency in a λ/4 strong cavity construction using a high-refractive index out-coupling layer. The refractive index of the out-coupling layer used here at λ is 2.4 and its wavelength dispersibility is identical to that of FIG. 7. Here, the extinction coefficient of the layer is set to zero for simplicity. The constructions of the organic compound layers, anodes, and cathodes of constructions A' to N' of FIG. 9 are identical to those of the constructions A to N of FIG. 7, and the thicknesses of the hole transport layer, the electron transport layer, and the out-coupling layer are optimized so that the luminous efficiency at chromaticity coordinates CIE_Yxy of (0.136, 0.66) may be maximum. Also illustrated is the Ag thickness dependence of each of the constructions B and C (the constructions L' to N'). As described above, the wavenumber of the LRSP changes with the thickness of the cathode. Accordingly, the construction M' is a construction having the smallest value for the δk(Re).

The δk(Re) of the element using a high-dielectric constant out-coupling layer of FIG. 9 shifts to a negative direction as compared with that of the element of FIG. 7, provided that such a tendency that the luminous efficiency becomes higher as the δk(Re) reduces is found to be held in each construction of the constructions B', C', K', and L' to N' where high cavity intensities can be expected. Accordingly, the optimum thickness of Ag in the Al anode (or the Mg anode) is 26 nm to 22 nm (24 nm in the case of Mg).

Figure 10:
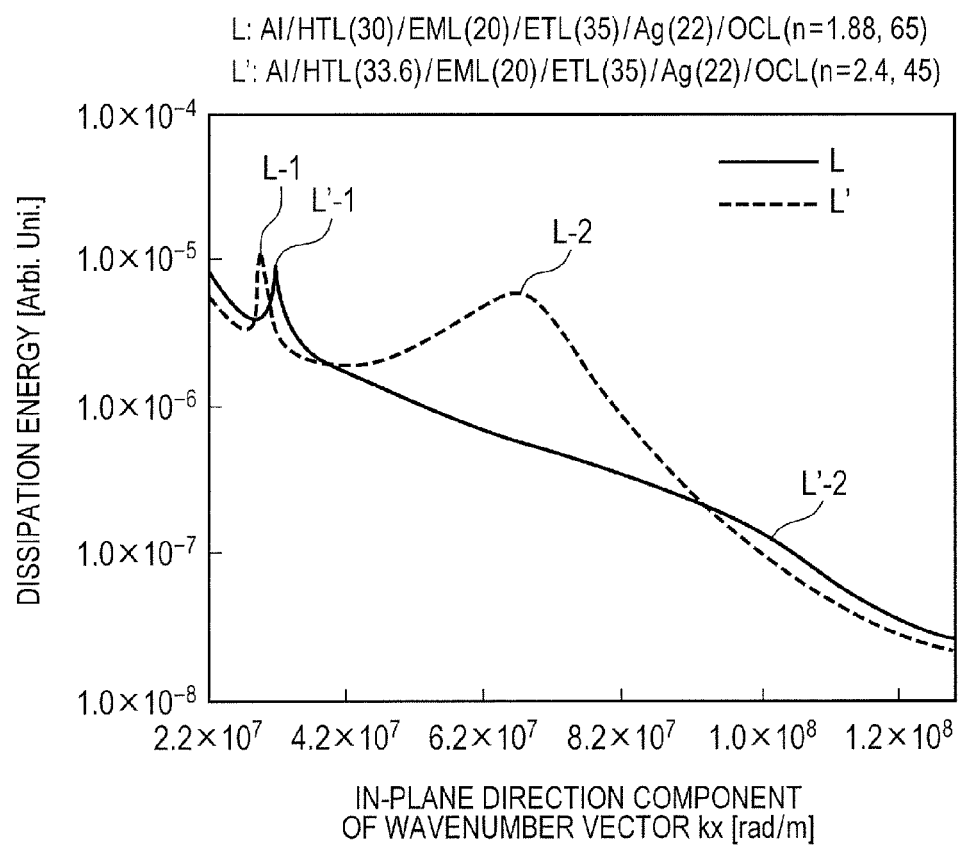
FIG. 10 is a diagram showing the SP energy dissipation of an x component of each of an element construction L and an element construction L' of FIG. 9.

For information, the luminous efficiency of the element using the high-dielectric constant out-coupling layer of FIG. 9 is improved as compared with that of the element of FIG. 7. The high-dielectric constant out-coupling layer is known to be capable of suppressing the absorption of propagating light at the cathode (H. Riel et. al., Appl. Phys. Lett. 82, 466-468 (2003)). In addition, the SRSP localized at the cathode can also be suppressed. FIG. 10 shows an effect of the high-dielectric constant out-coupling layer on the SP energy dissipation of the x component. The thicknesses of the organic compound layers of both the constructions L and L' (FIG. 9) are each optimized so that the luminous efficiency at chromaticity coordinates CIE_Yxy of (0.136, 0.66) may be maximum. Comparison between SRSP modes (L-2 and L'-2) shown in FIG. 10 shows that the absorption of the L'-2 reduces.

In view of the foregoing, element parameters (a material and a thickness) in the B element satisfying the formulae (I) and (II) are desirably set so that the δk(Re) may be small. As indicated by a broken line in FIG. 9, a desired range of the δk(Re) [rad/m] in the present invention specifically satisfies the relationship of the following formula (III). It should be noted that in the present invention, the real parts of the wavenumbers of SPs generated at the first electrode and the second electrode at a frequency $\omega=2\pi C_0/\lambda$ ($C_0$ represents the phase velocity of light in a vacuum) at the maximum peak wavelength λ are represented by $k_r(Re)$ and $k_s(Re)$, respectively, and $\delta k(Re)=k_r(Re)-k_s(Re)$.

$$-4.5\times10^6 \delta k(Re) \leq 2.1\times10^6 \quad \text{Formula (III)}$$

In consideration of the refractive index of a charge transport layer to be typically used, a material for the reflecting electrode 20 is preferably a material having a reflectance with respect to air in a B region of 85% or more and a plasma frequency $\omega_p$ of $16.0\times10^{15}$ [s$^{-1}$] or more. Al or (sputtered) Mg, or an Al alloy or Mg alloy to which any other metal has been added to such an extent that its optical characteristics do not change is particularly preferred. In addition, in order that charge injection property may be improved, a metal thin film may be laminated on each of the Al (alloy) and the Mg (alloy) to such an extent that the reflectance and the SP dispersion characteristic are satisfied. With regard to the cathode, Ag or Al, or an Ag alloy or Al alloy to which any other metal has been added to such an extent that its optical characteristics do not change is preferred because any such material can increase the cavity intensity. In addition, in order that the charge injection property may be improved, a metal thin film may be laminated on each of the Al (alloy) and the Ag (alloy) to such an extent that the SP dispersion characteristic is satisfied.

Hereinafter, an element structure that satisfies the equation (8) is exemplified. Refractive indices at λ=450 nm of OCL, ETL, and HTL at peak wavelength of EL spectrum emitted from the element are defined as $n_{ocl}$, $n_{etl}$, and $n_{htl}$, respectively. In combination of Al anode and Ag cathode, in the case of $n_{ocl}$=2.4 and $n_{etl}$=1.9, $n_{htl}$ and Ag film thickness range (nm) are (1.9, and 8 to 29 nm); (1.7, and 6 to 26 nm); (1.5, and 4 to 27 nm), respectively. In case of $n_{ocl}$=1.9 and $n_{etl}$=1.9, $n_{htl}$ and Ag film thickness range (nm) are (1.9, and 8 to 38 nm); (1.7, and 7 to 34 nm); and (1.5, and 3 to 32 nm), respectively. In combination of an anode in which Mo having a thickness of 6 nm is laminated on Al anode and Ag cathode, in case of $n_{ocl}$=1.9 and $n_{etl}$=1.9, $n_{htl}$ and Ag film thickness range (nm) are (1.9, and 18 to 40 nm); (1.7, and 8 to 38 nm); and (1.5, and 4 to 34 nm), respectively.

As described above, the element structure is determined so as to improve cavity intensity in the range satisfying the condition of the equation (8).

It should be noted that the thickness and refractive index of the out-coupling layer are desirably adjusted, and at least one reflecting surface is desirably formed on the upper portion of the cathode. Table 2 shows the luminous efficiency of each of B elements 105b and 106b free of any reflecting surface as comparative examples. The symbol "∞" in Table 2 means that a thickness is larger than the coherence length of light. SiN and air are assumed as media on the cathodes of the B elements 105b and 106b, respectively. The B element 105b has lower luminous efficiency than that of the element 102b despite the fact that the element satisfies a gap plasmon suppression condition. The foregoing is attributable to a significant reduction in its cavity intensity (a reduction in the numerator of the equation (4)). The table also shows the element 106b the upper portion of the cathode of which is air. Its luminous efficiency is additionally low as compared even with that of the element 105b. This is because when the out-coupling layer is air, the LRSP mode of the cathode disappears and hence the gap plasmon suppression condition is no longer satisfied.

In the present invention, when the dielectric constants of the out-coupling layer and the electron transport layer joined to the cathode are represented by $\in_{ocl}$ and $\in_{etl}$, respectively, such design that the relationship of $\in_{ocl} \leq \in_{etl}$ is satisfied is desirably performed.

Table 3 shows the luminous efficiency of each of a B element 107b whose out-coupling layer is increased in refractive index, a B element 108b whose electron transport layer is increased in refractive index, a B element 109b whose out-coupling layer is reduced in refractive index, and a B element 110b whose electron transport layer is reduced in refractive index as comparative examples. Here, the extinction coefficient of each organic compound layer is set to zero for simplicity. The construction of each element is of a structure "substrate/anode/hole transport layer (HTL)/emission layer (EML)/electron transport layer (ETL)/cathode/out-coupling layer (OCL)". In addition, the thickness of the emission layer is fixed to 20 nm in all element structures, and the thicknesses of the hole transport layer, the electron transport layer, and the out-coupling layer are optimized for the element of each color so that the formulae (I) and (II) may be satisfied. In addition, n and d in Table 3 represent a refractive index and a thickness [nm] at $\lambda_{max}$, respectively. It can be understood from Table 3 that the B elements 102b, 107b, and 110b satisfying the relationship of $n_{ocl} \geq n_{etl}$ each have improved luminous efficiency as compared with that of each of the elements 108b and 109b. When the relationship is satisfied, an increase in cavity intensity and absorption derived from a cathode can be alleviated, and hence a suppressing effect on a gap plasmon can be elicited in an additionally effective fashion.

TABLE 3

| Element | Anode Material | Anode d [nm] | HTL n | HTL d [nm] | ETL n | ETL d [nm] | Cathode Material | Cathode d [nm] | OCL n | OCL d [nm] | η [cd/A] | CIE_Yxy [Arbi. Uni.] | δk(Re) [rad/m] |
|---|---|---|---|---|---|---|---|---|---|---|---|---|---|
| 102b | Al | 200 | 1.88 | 31.5 | 1.88 | 35 | Ag | 26 | 1.88 | 65 | 4.1 | (0.137, 0.066) | $-1.7 \times 10^5$ |
| 107b | Al | 200 | 1.88 | 27.5 | 1.88 | 35 | Ag | 26 | 2.19 | 50 | 4.3 | (0.137, 0.066) | $-2.1 \times 10^6$ |
| 108b | Al | 200 | 1.88 | 28.8 | 2.19 | 30 | Ag | 26 | 1.88 | 65 | 3.0 | (0.137, 0.067) | $-1.4 \times 10^6$ |
| 109b | Al | 200 | 1.88 | 27.5 | 1.88 | 35 | Ag | 26 | 1.75 | 72.5 | 4.0 | (0.136, 0.066) | $1.2 \times 10^6$ |
| 110b | Al | 200 | 1.88 | 28.8 | 1.75 | 36.7 | Ag | 26 | 1.88 | 65 | 4.7 | (0.136, 0.065) | $8.6 \times 10^5$ |

The wavenumber of a gap plasmon is desirably as small as possible to such an extent that the gap plasmon suppression condition is established. This is because reducing the wavenumber of the gap plasmon can reduce DOS of the gap plasmon and can reduce the excitation rate of an SP in a z direction (see I. Gontijo et. al., Physical Review B, Vol. 60, (1999), 11,564. for a definition equation for the state density).

An effective method of reducing the wavenumber of the gap plasmon is to reduce the complex dielectric constants of the hole transport layer joined to the anode and of the electron transport layer joined to the cathode as well as to cause the SP of the anode and the LRSP of the cathode to substantially coincide with each other. FIG. 11 shows a relationship between the wavenumber of the gap plasmon and luminous efficiency. Here, an element construction is of a structure "substrate/Al anode/hole transport layer (HTL)/emission layer (EML)/electron transport layer (ETL)/Ag cathode/out-coupling layer (OCL)". In addition, the thicknesses of the emission layer and the Ag cathode are fixed to 20 nm and 26

TABLE 2

| Element | Anode Material | Anode d [nm] | HTL n | HTL d [nm] | ETL n | ETL d [nm] | Cathode Material | Cathode d [nm] | OCL n | OCL d [nm] | η [cd/A] | CIE_Yxy [Arbi. Uni.] | δk(Re) [rad/m] |
|---|---|---|---|---|---|---|---|---|---|---|---|---|---|
| 102b | Al | 200 | 1.88 | 31.5 | 1.88 | 35 | Ag | 26 | 1.88 | 65 | 4.1 | (0.137, 0.066) | $-1.7 \times 10^5$ |
| 105b | Al | 200 | 1.88 | 28.8 | 1.88 | 35 | Ag | 26 | 1.99 | ∞ | 3.3 | (0.135, 0.068) | $-2.6 \times 10^6$ |
| 106b | Al | 200 | 1.88 | 27.5 | 1.88 | 35 | Ag | 26 | 1 | ∞ | 3.0 | (0.133, 0.066) | — | nm, respectively in all element structures, and the thicknesses of the hole transport layer, the electron transport layer, and the out-coupling layer are optimized for the element of each color so that the formulae (I) and (II) may be satisfied. In this investigation, the SP wavenumbers of the anode and the cathode are adjusted by reducing the refractive indices of the hole transport layer and the electron transport layer. Here, the extinction coefficient of each organic compound layer is set to zero for simplicity.

It can be understood from FIG. 11 that reducing the refractive indices of the hole transport layer and the electron transport layer reduces the wavenumber of the gap plasmon and hence improves the luminous efficiency. For information, comparison between constructions P and R shows that the construction R has higher luminous efficiency than that of the construction P despite the fact that the wavenumber of the gap plasmon of the construction P is smaller than that of the construction R. This is because a reduction in refractive index of the electron transport layer also serves as the suppression of the SRSP localized at the cathode. In a construction S in which both the refractive indices of the hole transport layer and the electron transport layer are reduced, the wavenumber of the gap plasmon can be significantly reduced and hence the luminous efficiency can be dramatically improved.

In this regard, however, in the gap plasmon suppression condition, the refractive index of at least one of the charge transport layers is desirably equal to or smaller than the refractive index of the emission layer.

Table 4 also shows elements 113b and 114b having reduced refractive indices of the first charge transport layer and the second charge transport layer, respectively, as well as the emission layer. Both of the elements 113b and 114b have higher luminous efficiency than the element 111b. When the refractive index of the charge transport layer that is in contact with the electrode is reduced, the cavity intensity can be increased. Hence, even when the emission layer has a small refractive index, the luminous efficiency η can be improved. In addition, the SP coupling ratio $W_{sp}$ of each of the elements 113b and 114b is small as compared to the element 112b. When the refractive index of the charge transport layer that is in contact with the electrode is reduced, the wavenumber of the gap plasmon can be easily reduced. That is, the DOS of the gap plasmon represented by the formula (7) can be reduced, and the excitation rate of the SP can be reduced as compared to the element 112b.

That is, in the gap plasmon suppression condition, the refractive index of at least one of the charge transport layers is desirably designed so as to be equal to or smaller than the refractive index of the emission layer. A most desired case is, as shown in an element 115b, a case where both of the refractive indices of the first charge transport layer and the second charge transport layer are smaller than the refractive index of the emission layer in a state in which the wavenumber of the gap plasmon is reduced. In this case, the SP coupling efficiency reduces and the luminous efficiency remarkably increases.

TABLE 4

| Element | HTL | | EML | | ETL | | CIE_Yxy | η [cd/A] | $W_{sp}$ [%] | Kgap (Re) [$10^7$ rad/m] |
| --- | --- | --- | --- | --- | --- | --- | --- | --- | --- | --- |
| | n | d [nm] | n | d [nm] | n | d [nm] | | | | |
| 111b | 1.88 | 33.6 | 1.88 | 20 | 1.88 | 35 | (0.139, 0.066) | 4.5 | 46.9% | 3.17 |
| 112b | 1.88 | 36 | 1.65 | 23 | 1.88 | 35 | (0.140, 0.066) | 4.1 | 56.3% | 3.06 |
| 113b | 1.65 | 37 | 1.65 | 23 | 1.88 | 35 | (0.140, 0.066) | 5.0 | 53.7% | 2.91 |
| 114b | 1.88 | 37 | 1.65 | 23 | 1.65 | 35 | (0.139, 0.066) | 5.1 | 50.3% | 2.86 |
| 115b | 1.65 | 37 | 1.88 | 20 | 1.65 | 40 | (0.138, 0.065) | 7.3 | 28.2% | 2.75 |

Table 4 shows relationships among the refractive index and luminous efficiency of an organic compound, an SP coupling ratio $W_{sp}$, and the wavenumber of a gap plasmon in elements satisfying the gap plasmon suppression condition. Here, the constructions of the elements are "support substrate/Al anode/hole transport layer/emission layer/electron transport layer/Ag cathode (22 nm)/out-coupling layer (45 nm)". In all the constructions, the thicknesses are optimized so that spectra in a front surface direction may have chromaticity coordinates CIE_Yxy of (0.139, 0.66). In addition, in order to reduce the influence of the SRSP localized in the cathode, the refractive index of the out-coupling layer was set to 2.4. A comparison of an element 111b with an element 112b reveals that luminous efficiency reduces in the element 112b in which the refractive index of the emission layer is smaller than those of the two charge transport layers. In the element 112b, the wavenumber of the gap plasmon is smaller than that in the element 111b, but the SP coupling ratio $W_{sp}$ increases. This increase in the SP coupling ratio is attributable to the fact that the electric field of the SP in a z direction increases. In other words, a dielectric flux density D in a z direction is continuous, and hence, as the dielectric constant $\in_{eml}$ of the emission layer becomes smaller, the electric field $E_{sp}=D/\in_{eml}$ becomes larger. As a result, the surface plasmon excitation rate of the formula (7) increases.

In the gap plasmon suppression condition, it is desired to use, as the light emitting molecule in the emission layer, a light emitting molecule whose transition dipole has an orientation state in a direction perpendicular to the thickness direction of the emission layer (substrate in-plane direction). The use of 4,40-bis[4-(diphenylamino)styryl]biphenyl (BDASBi), which is a known material, or the like allows the orientation distribution state of the transition dipole to be biased in the substrate in-plane direction. In addition, the orientation state of the transition dipole can be evaluated based on spectrum angle dependency, which is a well-known method as described in J. Frischeisen et al., Organic Electronics 12, (2011), 809-817 and the like.

Table 5 shows $W^{para}_{oc}$, $W^{para}_{sp}$, and chromaticity coordinates and luminous efficiency in a front surface direction in the case where a transition dipole has a perfectly horizontal orientation distribution state in three kinds of B elements. Here, the $W^{para}_{oc}$ corresponds to a ratio of energy extracted to the outside to produced exciton energy, and the $W^{para}_{sp}$ corresponds to a ratio of energy coupled with an SP to the produced exciton energy.

Figure 12:
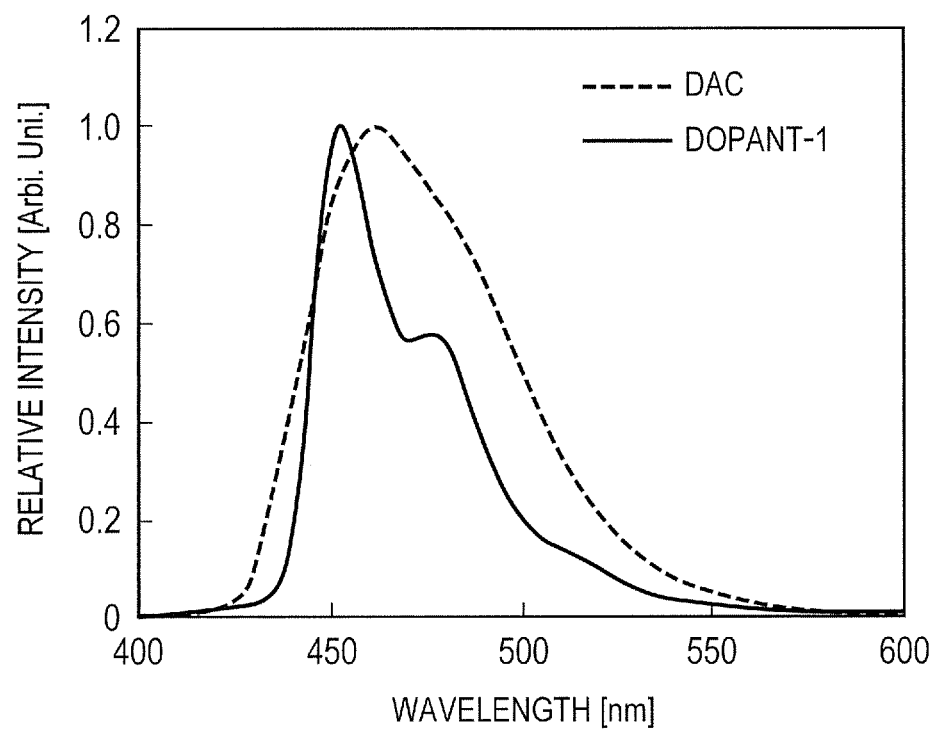
FIG. 12 is a diagram showing the PL spectra of a dopant-1 and 2,8-diaminochrysene (DAC).

A value obtained by multiplying the $W^{para}_{oc}$, a ratio of energy extracted to the outside, by a carrier balance factor and exciton production efficiency corresponds to external quantum efficiency. In addition, values enclosed in parentheses in $W^{para}_{sp}$ of Table 5 are ratios of decrease in SP energy coupling $\delta W_{sp}$ through the horizontal orientation of a transition dipole. In other words, in the case where the transition dipole has a random orientation distribution, when the SP energy coupling ratio is defined as $W^{iso}_{sp}$, the equation $\delta W_{sp} = (W^{para}_{sp}/W^{iso}_{sp})-1$ is established. A construction investigated here is of a structure "support substrate/first electrode/first charge transport layer/emission layer (20 nm)/second charge transport layer/second electrode/out-coupling layer". The refractive index and dispersion curve of the EML are equal to those of the charge transport layer. FIG. 12 shows the PL spectrum of a dopant-1, and the exciton production efficiency and emission quantum efficiency were assumed to be 0.25 and 0.8, respectively. Such a design that the thicknesses of the first charge transport layer and the second charge transport layer in the B elements 116b and 117b satisfy the formulae (I) and (II) and the front surface spectra have chromaticity coordinates CIE_Yxy of (0.138, 0.60) is adopted. The table also shows an element 118b having a bottom emission construction as a comparative example. The thickness of the first charge transport layer of the element 118b was equal to that of the element 117b.

The table reveals that the $\delta W_{sp}$ of the element 117b satisfying the gap plasmon suppression condition is −87.2%, which is the largest as compared to any other construction. In other words, the element 117b has a large effect of suppressing surface plasmon loss by horizontally orienting the transition dipole. As a result, the $W^{para}_{sp}$ of the element 117b is about 5%, which is the smallest as compared to any other construction. This is attributable to the fact that when the gap plasmon suppression condition is satisfied, as seen from FIG. 5, the x component of the electric field generated by the SP becomes zero in the EML. A bottom emission construction as disclosed in J. Frischeisen et. al., Organic Electronics 12, (2011), 809-817 has only one dielectric/metal interface, and hence the electric field of an SP generated at the interface is a semi-loop electric field. In other words, in a region where the electric field of the SP is applied, the x component of the electric field of the SP cannot be set to zero. The foregoing can be understood from the fact that the $\delta W_{sp}$ of the element 118b is −77.5%, which is smaller than that of the element 117b. The use of the light emitting molecule which satisfies the gap plasmon suppression condition and whose transition dipole has orientational order in the in-plane direction of the emission layer as described above allows surface plasmon loss to be suppressed significantly and allows front surface luminous efficiency and external quantum efficiency to be improved remarkably. The orientation state of the transition dipole can be evaluated based on spectrum angle dependency, which is a well-known method as described in J. Frischeisen et. al., Organic Electronics 12, (2011), 809-817 and the like.

pression condition in the B element is preferably selected. Table 6 shows the power consumptions of display apparatuses constituted of the organic EL elements 101 and 102 at 250 cd/m$^2$. The calculation is performed under the conditions of 3 inches, a ratio "vertical:horizontal" of 3:4, an aperture ratio of 25%, and a driving voltage of 8.7 V.

In addition, a display apparatus 101rgb is constituted of the B element 101b, the G element 101g, and the R element 101r, and a display apparatus 102rgb is constituted of the B element 102b, the G element 102g, and the R element 102r. It can be understood from Table 6 that the display apparatus 102rgb constituted of the B element 102b satisfying the gap plasmon suppression condition has a lower power consumption than that of the display apparatus 101rgb.

In addition, a layer above the emission layer such as the electron transport layer, the cathode, or the out-coupling layer is often formed as a common layer from the viewpoints of a yield and process simplicity. In such case as well, a combination satisfying the gap plasmon suppression condition in the B element is preferably selected. Table 6 shows comparison between display apparatuses 103rgb and 104rgb. The term "103rgb" as used herein corresponds to the case where the element is constituted of the same kinds of materials as those of the organic EL elements 101, and the thicknesses of the electron transport layer, cathode, and out-coupling layer of each of the R element and the G element are the same as those of the B element 101b (an R element 103r and a G element 103g). Similarly, the term "104rgb" corresponds to the case where the thicknesses of the hole transport layer and out-coupling layer of each of the R element and the G element are the same as those of the B element 102b (an R element 104r and a G element 104g). It is found that as in a relationship between the display apparatuses 101rgb and 102rgb, the power consumption of the display apparatus 104rgb as a combination satisfying the gap plasmon suppression condition in the B element is smaller than that of the display apparatus 103rgb.

TABLE 6

|  | η [cd/A] | | | Power consumption |
| --- | --- | --- | --- | --- |
|  | R | G | B | [mW] |
| 101rgb | 45.2 | 33.9 | 3.2 | 296.8 |
| 102rgb | 29.1 | 30.9 | 4.1 | 292.0 |
| 103rgb | 29.6 | 29.9 | 3.2 | 326.6 |
| 104rgb | 22.2 | 26.9 | 4.1 | 324.4 |
| 105rgb | 45.2 | 33.9 | 4.1 | 265.2 |
| 106rgb | 29.6 | 29.9 | 4.1 | 295.2 |

In addition, in the case where different reflecting electrodes are adopted for the R, G, and B elements, a combination maximizing the cavity intensity is preferably selected in each

TABLE 5

| Element | 1st electrode | | 1st CTL | | 2nd CTL | | 2nd electrode | | OCL | | | | | |
| --- | --- | --- | --- | --- | --- | --- | --- | --- | --- | --- | --- | --- | --- | --- |
|  | Material | d [nm] | n | d [nm] | n | d [nm] | Material | d [nm] | n | d [nm] | $W^{para}_{oc}$ [%] | $W^{para}_{sp}$ [%] ($\delta W_{sp}$ [%]) | CIE_Yxy | η [cd/A] |
| 116b | Ag | 200 | 1.88 | 29.4 | 1.88 | 35 | Ag | 22 | 2.4 | 45 | 18.6% | 41.2% (−38.8%) | (0.138, 0.060) | 4.6 |
| 117b | Al | 200 | 1.88 | 37 | 1.88 | 35 | Ag | 22 | 2.4 | 45 | 36.6% | 5.1% (−87.2%) | (0.138, 0.060) | 8.0 |
| 118b | Al | 200 | 1.88 | 37 | 1.88 | 35 | IZO | 73 | 1.5 | ∞ | 30.3% | 9.9% (−77.5%) | (0.136, 0.089) | 7.4 |

In a display apparatus constituted by using the B element satisfying the formulae (I) and (II), when a reflecting electrode and a transparent electrode are common to the R, G, and B elements, a combination satisfying the gap plasmon suppression condition in the B element is preferably selected. Table 6 shows the power consumptions of display apparatuses 105rgb and 106rgb. The display apparatus 105*rgb* is constituted of the R, G, and B elements (101*r*, 101*g*, and 102*b*), and the display apparatus 106*rgb* is also constituted of the R, G, and B elements (103*r*, 103*g*, and 102*b*). The power consumption of the display apparatus 105*rgb* is reduced as compared with that of the display apparatus 102*rgb*, and the power consumption of the display apparatus 106*rgb* is also reduced as compared with that of the display apparatus 104*rgb*.

As described above, in the organic EL element of the present invention, the SP loss in a metal electrode is reduced, and the luminous efficiency is high. Thus, higher characteristics are obtained by applying the present invention to various apparatuses each using the organic EL element. A specific example is a light emitting apparatus including the organic EL element of the present invention and a control circuit for controlling light emission of the organic EL element. Examples of the light emitting apparatus include an exposure light source of lighting equipment and an electrophotographic image forming apparatus, and a backlight of a liquid crystal display apparatus. An image forming apparatus includes an exposure light source (the light emitting apparatus), a photosensitive member on which a latent image is to be formed by the exposure light source, and charging means for charging the photosensitive member.

In addition, in a light emitting element array in which an organic EL element for emitting a blue color, an organic EL element for emitting a green color, and an organic EL element for emitting a red color are arrayed, the organic EL element of the present invention can be used as the organic EL element for emitting a blue color.

The light emitting element array can be used in a display apparatus. Specifically, the display apparatus is provided with the light emitting element array and a control circuit for displaying a desired image in the light emitting element array based on an image signal input from the outside. Examples of the display apparatus include display portions of a TV receiver, a personal computer, a mobile phone, a portable game machine, a mobile music player, a personal digital assistant (PDA), and a car navigation system.

In addition, the light emitting element array of this embodiment may be placed in a display portion or an electronic viewfinder of an imaging apparatus such as a digital camera and a digital video camera. The imaging apparatus further includes an imaging optical system and an imaging element such as a CMOS sensor for imaging. In addition, the imaging element is placed at a position except the top of the light emitting surface of the light emitting element array.

Hereinafter, a specific example of the present invention is described.

Example 1

Example 1 shows that the gap plasmon suppression condition (the formula (III)) is established even in different PL spectra.

FIG. 12 shows the PL spectrum of a dopant-1 used in this investigation. The PL spectrum of the dopant-1 has a peak wavelength of 451 nm and has double peaks.

Figure 13:
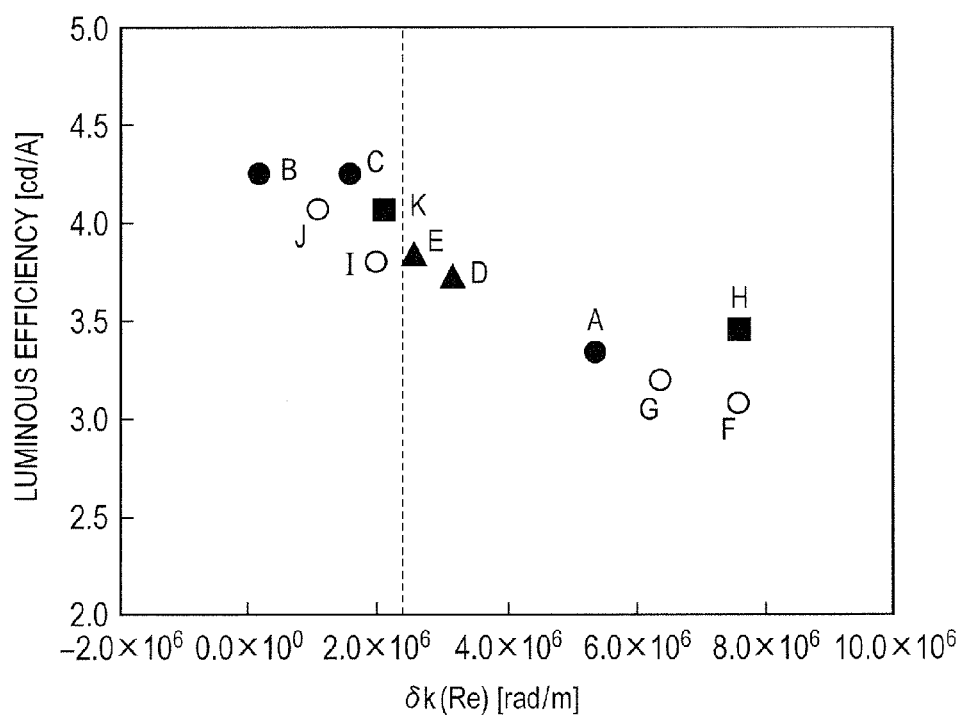
FIG. 13 is a diagram showing a relationship between the wavenumber difference δk(Re) and the luminous efficiency when the refractive index n of the out-coupling layer equals 1.88 in the case where a light emitting molecule is the dopant-1.
Figure 14:
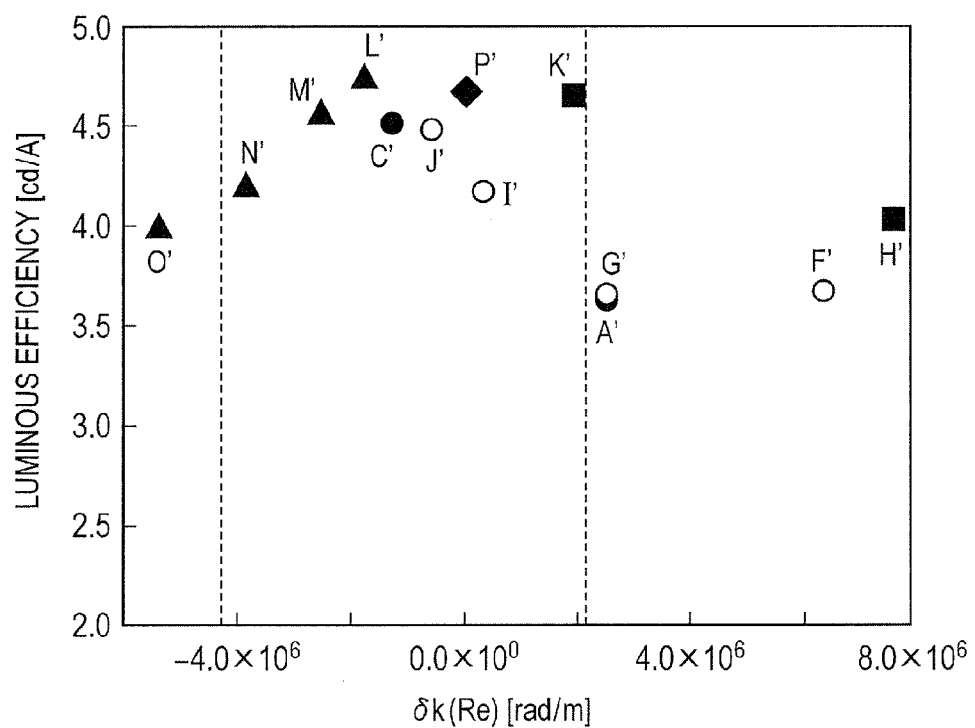
FIG. 14 is a diagram showing a relationship between the wavenumber difference δk(Re) and the luminous efficiency when the refractive index n of the out-coupling layer equals 2.4 in the case where the light emitting molecule is the dopant-1.

FIG. 13 and FIG. 14 each show a relationship between the wavenumber difference $\delta k(Re)$ between the SPs of an anode and a cathode, and luminous efficiency in the case where a light emitting molecule is the dopant-1. The refractive indices of the out-coupling layers of FIG. 13 and FIG. 14 at $\lambda_{max}$ are 1.88 and 2.4, respectively. Each element construction investigated here is of a structure "substrate/anode/hole transport layer (HTL)/emission layer (EML)/electron transport layer (ETL)/cathode/out-coupling layer (OCL)". The dielectric constant (or refractive index) of an organic compound layer and its dispersion characteristic in this investigation are identical to those of FIG. 7. In addition, the thicknesses of the hole transport layer, the electron transport layer, the cathode, and the out-coupling layer are optimized so that the luminous efficiency at chromaticity coordinates CIE_Yxy of (0.137, 0.60) may be maximum to such an extent that the formulae (I) and (II) are satisfied.

The relationship between the $\delta k(Re)$ and the luminous efficiency in each of FIG. 13 and FIG. 14 showed the same tendency as that obtained for DAC (FIG. 7 or FIG. 9), and hence it was confirmed that the gap plasmon suppression condition (the formula (III)) was satisfied.

Example 2

The effects of the constructions A and B in the results obtained by a simulation shown in FIG. 7 are confirmed.

AlNd and Ag/ITO anodes were used in this example. The AlNd anode was formed by forming an aluminum alloy (AlNd) into a film having a thickness of 100 nm on a glass substrate by a sputtering method. Nd is added at a ratio of 2.0 mass %.

It has been confirmed that the addition ratio of Nd has no influences on the optical characteristics of Al. In addition, the Ag/ITO anode was obtained by: forming Ag into a film having a thickness of 100 nm on a glass substrate; and forming ITO into a film having a thickness of 10 nm on the film. The sputtering method is employed for forming both Ag and ITO into the films. Organic compound layers were sequentially formed on such anode by a vacuum deposition method. A film formation order is as described below. Compound 1 described below was formed into a film having a thickness of 20 nm to serve as a hole transport layer on the AlNd anode, and the compound was also formed into a film having a thickness of 5 nm to serve as a hole transport layer on the Ag/ITO anode.

Compound 1

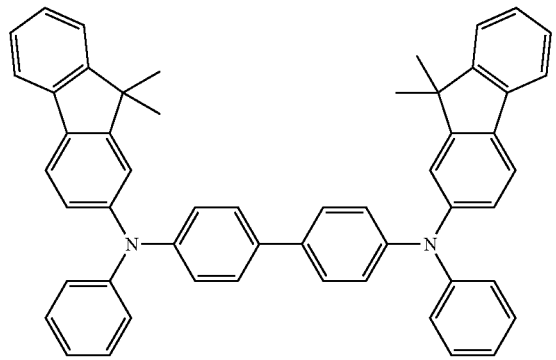

Next, Compound 2 having the following structure was formed into a film having a thickness of 10 nm to serve as an electron blocking layer. Next, Compound 3 and Compound 4 having the following structures were co-deposited from the vapor at film formation rates of 0.98 Å/s and 0.02 Å/s, respectively to serve as an emission layer. Thus, an emission layer having a thickness of 20 nm was formed. Next, Compound 6 having the following structure was formed into a film having a thickness of 20 nm to serve as an electron transport layer. Next, Compound 6 having the following structure and Cs were co-deposited from the vapor at film formation rates of 3.0 Å/s and 0.3 Å/s, respectively to be formed into a film having a thickness of 10 nm, the film functioning as an electron injection layer. A light-transmissive metal thin film of Ag (24 nm) was formed as a cathode. It should be noted that the numerical value in the parentheses represents the thickness of the corresponding metal.

In addition, Compound 5 having the following structure was formed into a film having a thickness of 70 nm to serve as an out-coupling layer.

Compound 2

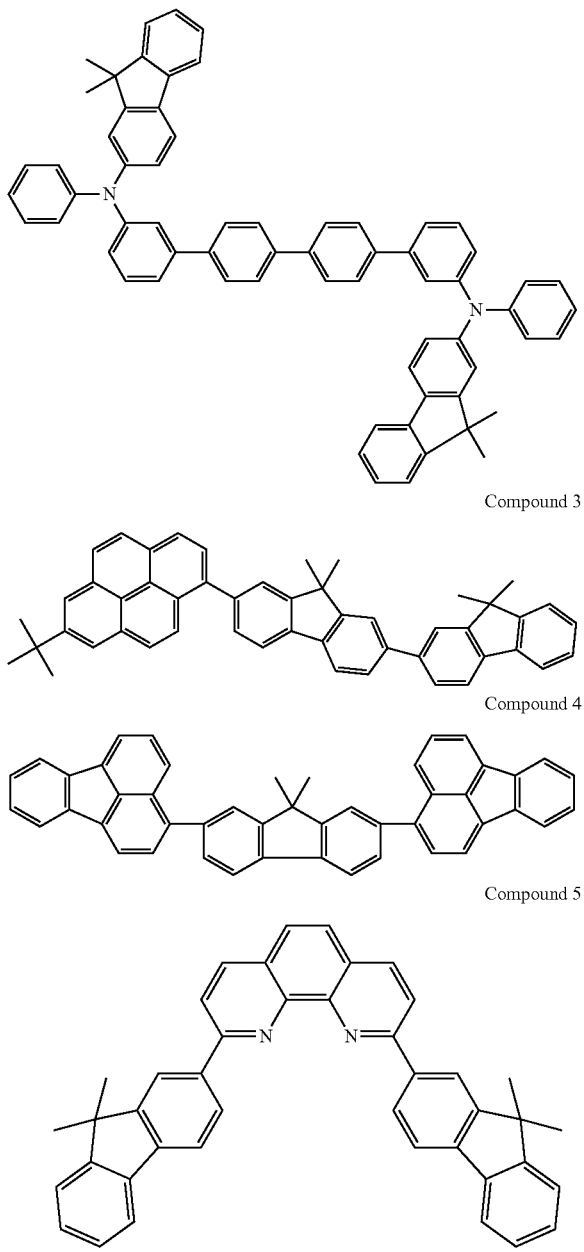

Compound 3

Compound 4

Compound 5

Finally, sealing glass (not shown) containing a drying agent and a film-formation surface of the glass substrate were sealed with a UV-curable resin in a glove box in a nitrogen atmosphere.

Table 7 shows the luminous efficiency of an organic EL element obtained in an experiment. In addition, the values for the refractive indices of the organic compound layers in Table 7 are values measured with a spectroscopic ellipsometer when the peak wavelength λ of light equals 450 nm. The δk(Re) was determined from the simulation method. The luminous efficiency of Example 1-1 using the Al:Nd anode satisfying the gap plasmon suppression condition was confirmed to be higher than that of Example 1-2 using the Ag/ITO anode.

Example 3

The effect by reducing the wavenumber of the gap plasmon, which provided high efficiency in the above-mentioned simulation result, is confirmed. This time, the case of decreasing the refractive index of a hole transport layer that was in contact with an anode was investigated.

In this example, two hole transport layers having different refractive indices were used. One of the hole transport layers was made of Compound 1 described above (refractive index n=1.88 at λ=450 nm), and the other one was made of Compound 6 (refractive index n=1.65 at λ=450 nm) having a refractive index lower than that of Compound 1.

Compound 6

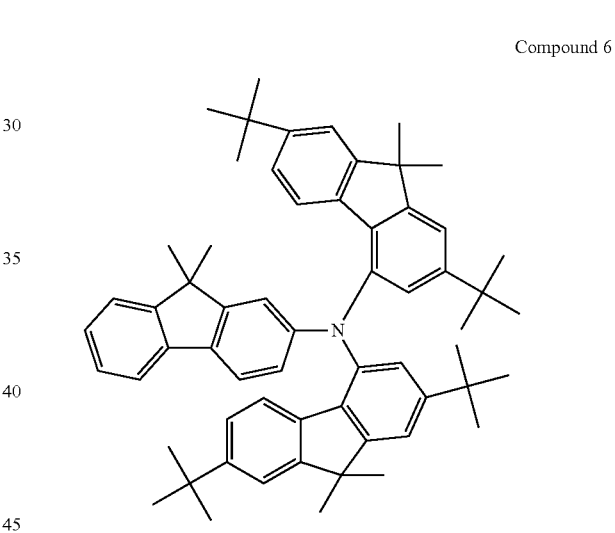

An element of this example was produced as follows. First, an aluminum alloy (AlNd) was formed into a film having a thickness of 100 nm on a glass substrate by a sputtering method to form an anode. Nd is added at a ratio of 2.0 mass %. Organic compound layers were sequentially formed on the anode by a vacuum deposition method. A film formation order is as described below. As a hole transport layer, Compound 1 described above was formed into a film having a thickness of 18 nm or Compound 6 was formed into a film

TABLE 7

| | Anode | | ITO | | HTL | | ETL | | EIL | | Cathode | | OCL | | η | CIE_Yxy | δk(Re) |
| --- | --- | --- | --- | --- | --- | --- | --- | --- | --- | --- | --- | --- | --- | --- | --- | --- | --- |
| | Material | d [nm] | n | d [nm] | n | d [nm] | n | d [nm] | n | d [nm] | Material | d [nm] | n | d [nm] | [cd/A] | [Arbi. Uni.] | [rad/m] |
| Example 1-1 | AlNd | 100 | — | — | 1.88 | 20 | 1.86 | 20 | 1.81 | 10 | Ag | 24 | 1.86 | 70 | 4.1 | (0.146, 0.056) | $1.53 \times 10^5$ |
| Example 1-2 | Ag | 100 | 1.96 | 10 | 1.88 | 5 | 1.86 | 20 | 1.81 | 10 | Ag | 24 | 1.86 | 70 | 2.5 | (0.140, 0.057) | $6.43 \times 10^6$ | having a thickness of 21 nm, and as an electron blocking layer, Compound 2 having the structure described above was formed into a film having a thickness of 10 nm. Next, as an emission layer, Compound 3 and Compound 4 having the structures described above were co-deposited from the vapor at film formation rates of 0.98 Å/s and 0.02 Å/s, respectively. Thus, an emission layer having a thickness of 20 nm was formed. Then, as an electron transport layer, Compound 5 having the structure described above was formed into a film having a thickness of 30 nm. Then, as a cathode, a light-transmissive laminated metal thin film of AgCs (6 nm)/Ag (20 nm) was formed. Here, the Ag alloy made of Ag and Cs was placed on the side of the cathode that was in contact with the electron transport layer, thereby facilitating the injection of electrons into the electron transport layer. It should be noted that the numerical values in the parentheses represent the thicknesses of the corresponding metals. Cs doping at the Cs concentration showed no influences on the optical characteristics of Ag. In addition, Compound 5 having the foregoing structure was formed into a film having a thickness of 70 nm to serve as an out-coupling layer.

Finally, sealing glass (not shown) containing a drying agent and a film-formation surface of the glass substrate were sealed with a UV-curable resin in a glove box in a nitrogen atmosphere.

It should be noted that any of the organic EL elements produced in this example has a $\lambda/4$ construction. In addition, the SP wavenumber difference between the anode and the cathode in Compound 1, and that in Compound 2 are $1.5 \times 10^5$ and $7.4 \times 10^5$ [rad/m], respectively, and hence each element satisfies the formula (III).

Figure 15:
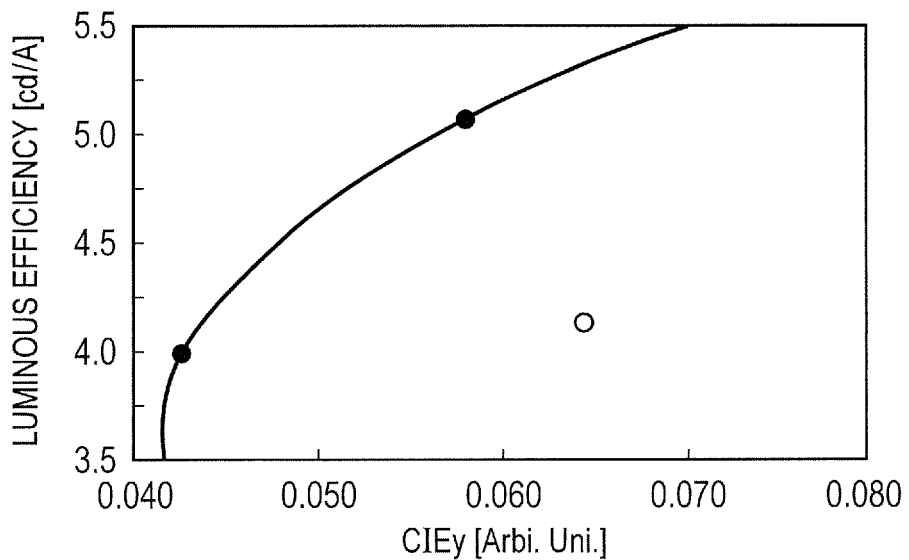
FIG. 15 is a diagram showing a chromaticity-efficiency curve determined by an experiment for an organic EL element in each example of the present invention.
Figure 16:
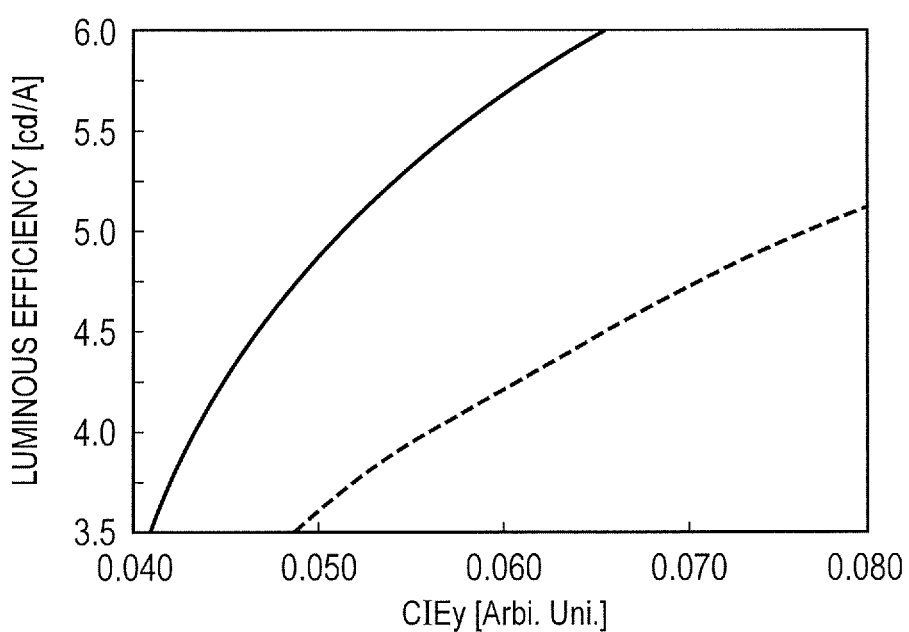
FIG. 16 is a diagram showing a chromaticity-efficiency curve determined by a simulation for the organic EL element in each example of the present invention.

FIG. 15 shows a chromaticity-luminous efficiency curve of the organic EL element obtained in the experiment, and FIG. 16 shows a result obtained by simulating a layer construction corresponding to each organic EL element. The organic EL element using Compound 1 for the hole transport layer represented by an open circle plot in FIG. 15 has a luminous efficiency of about 4.1 cd/A at CIEy of 0.065. On the other hand, the organic EL element using Compound 2 having a lower refractive index represented by a filled circle and curve in FIG. 15 shows high luminous efficiency of about 5.3 cd/A at CIEy of 0.065. Thus, an increase ratio of the luminous efficiency of the organic EL element using Compound 2 by decreasing the refractive index is 1.3 times that of the organic EL element using Compound 1. Further, in FIG. 16, a solid line indicates the element using Compound 2, and a broken line indicates the element using Compound 1. An increase ratio obtained in the simulation of Compound 2 is about 1.3 times that of Compound 1, and it is confirmed that the simulation result is consistent with the experimental result.

Specifically, in this example, it is confirmed that the simulation result is consistent with the experimental result, and it is shown that the luminous efficiency is improved by decreasing the refractive index of the hole transport layer 3 that is in contact with the anode and reducing the wavenumber of the gap plasmon.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application Nos. 2011-176583, filed Aug. 12, 2011, 2012-021715, filed Feb. 3, 2012, and 2012-158263, filed Jul. 17, 2012, which are hereby incorporated by reference herein in their entirety.

What is claimed is:

1. An organic electroluminescence element, comprising a first electrode formed of a metal layer, a first charge transport layer, an emission layer, a second charge transport layer, a second electrode formed of a metal layer, and an out-coupling layer in the stated order, the element causing light emitted by the emission layer to exit from a side of the second electrode, and the element emitting light having a maximum peak wavelength in an emission spectrum of 440 nm or more to 470 nm or less, wherein:

the first charge transport layer is in contact with the first electrode;

the second charge transport layer and the out-coupling layer are each in contact with the second electrode;

an optical path length L between a first interface between the first electrode and the first charge transport layer, and a second interface between the second electrode and the second charge transport layer satisfies the following relationship:

$$(-1-\phi/\pi) \times (\lambda/4) < L < (1-\phi/\pi) \times (\lambda/4)$$

where $\lambda$ represents the maximum peak wavelength, and $\phi$ represents a sum [rad] of phase shifts upon reflection of the light having the maximum peak wavelength $\lambda$ at the first interface and the second interface; and when a real part of a wavenumber of a surface plasmon generated at the first interface is represented by $k_r$ [rad/m] and a real part of a wavenumber of a surface plasmon generated at the second interface is represented by $k_s$ [rad/m], the following relationship is satisfied:

$$-4.5 \times 10^6 \leq k_r - k_s \leq 2.1 \times 10^6.$$

2. The organic electroluminescence element according to claim 1, wherein the surface plasmon of the second electrode comprises a long-range surface plasmon (LRSP).

3. The organic electroluminescence element according to claim 1, wherein the wavenumber of the surface plasmon of the second electrode is $2.2 \times 10^7$ to $3.5 \times 10^7$ [rad/m].

4. The organic electroluminescence element according to claim 1, wherein a dielectric constant of the out-coupling layer is larger than a dielectric constant of the second charge transport layer.

5. The organic electroluminescence element according to claim 1, wherein a dielectric constant of the first charge transport layer and a dielectric constant of the second charge transport layer are equal to or smaller than a dielectric constant of the emission layer.

6. The organic electroluminescence element according to claim 1, wherein the emission layer comprises a light emitting molecule whose transition dipole moment has an orientation state biased in a direction perpendicular to a thickness direction of the emission layer.

7. The organic electroluminescence element according to claim 1, wherein the optical path length L satisfies a relationship of $(-1-2\phi/\pi) \times (\lambda/8) \leq L \leq (1-2\phi/\pi) \times (\lambda/8)$.

8. The organic electroluminescence element according to claim 1, wherein the optical path length L satisfies a relationship of $\lambda/4 < L < 3\lambda/4$.

9. The organic electroluminescence element according to claim 1, wherein a physical distance between the first interface and the second interface is 58 nm or more to 186 nm or less.

10. The organic electroluminescence element according to claim 1, wherein the optical path length L satisfies a relationship of $3\lambda/8 \leq L \leq 5\lambda/8$.

11. The organic electroluminescence element according to claim 1, wherein a physical distance between the first interface and the second interface is 87 nm or more to 155 nm or less.

12. A light emitting apparatus, comprising:
the organic electroluminescence element according to claim 1; and
a control circuit for controlling light emission of the organic electroluminescence element.

13. An image forming apparatus, comprising:
the light emitting apparatus according to claim 12;
a photosensitive member on which a latent image is to be formed by the light emitting apparatus; and
charging means for charging the photosensitive member.

14. A light emitting element array, comprising:
an organic electroluminescence element for emitting a blue color;
an organic electroluminescence element for emitting a green color; and
an organic electroluminescence element for emitting a red color,
wherein the organic electroluminescence element for emitting the blue color comprises the organic electroluminescence element according to claim 1.

15. An imaging apparatus, comprising:
the light emitting element array according to claim 14; and
an imaging element placed at a position except a top of a light emitting surface of the light emitting element array.

16. A display apparatus, comprising:
the light emitting element array according to claim 14; and
a control circuit for displaying a desired image in the light emitting element array based on an image signal input from an outside.

* * * * *